(12) United States Patent
Saito

(10) Patent No.: US 8,283,662 B2
(45) Date of Patent: Oct. 9, 2012

(54) MEMORY DEVICE

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 12/946,095

(22) Filed: Nov. 15, 2010

(65) Prior Publication Data

US 2011/0114946 A1 May 19, 2011

(30) Foreign Application Priority Data

Nov. 18, 2009 (JP) ................................. 2009-262764

(51) Int. Cl.
*H01L 29/12* (2006.01)
(52) U.S. Cl. ................ 257/43; 257/40; 257/69; 257/70; 257/209; 257/315
(58) Field of Classification Search .................. None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,067,249 A * | 5/2000 | Lee et al. ................. | 365/185.05 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |

(Continued)

FOREIGN PATENT DOCUMENTS

EP 1 737 044 A1 12/2006

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

(Continued)

*Primary Examiner* — Kyoung Lee
(74) *Attorney, Agent, or Firm* — Fish & Richardson P.C.

(57) ABSTRACT

A memory device without additional logic circuits, including a memory cell which cannot be accessed by a third party and which is always accessible when needed. One embodiment is a memory device including a first memory cell and a second memory cell, and the second memory cell includes a second transistor having a second channel formed of an oxide semiconductor film. Data is read from the second memory cell when the second transistor is being irradiated with ultraviolet rays.

9 Claims, 16 Drawing Sheets

U.S. PATENT DOCUMENTS

| | | |
|---|---|---|
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0251816 A1 | 10/2008 | Tanaka et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0152607 A1 | 6/2009 | Tanaka et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 2-14150 U | 1/1990 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009135350 A | 6/2009 |
| JP | 2009-182194 A | 8/2009 |
| WO | 2004/114391 A1 | 12/2004 |
| WO | 2007029844 A1 | 3/2007 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or AL; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5). InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al.. "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTS With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81. No. 5, pp. 501-515.

Orita, M et al., "Mechanism of Electrical Conductivity of Transparent InGaZnO4," Phys. Rev. B (Physical Review. B), Jan. 15, 2000, vol. 61. No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park; et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Barquinha. P et al., "Effect of UV and visible light radiation on the electrical performances of transparent TFTs based on amorphous indium zinc oxide," J. Non-Cryst. Solids (Journal of Non-Crystalline Solids), Jun. 15, 2006, vol. 352, No. 9-20, pp. 1756-1760, in English.

International Search Report (Application No. PCT/JP2010/068789) Dated Jan. 25, 2011, in English.

Written Opinion (Application No. PCT/JP2010/068789) Dated Jan. 25, 2011, in English.

\* cited by examiner

MEMORY DEVICE

TECHNICAL FIELD

The present invention relates to a memory device including a transistor, particularly a memory device including a transistor using an oxide semiconductor film for a channel.

BACKGROUND ART

A memory device includes a plurality of memory cells. In some cases, it is necessary to prevent access to part of the memory cells by a third party such as a consumer. In Patent Document 1, a memory is disclosed in which data cannot be read without inputting a predetermined keyword. A third party cannot read the data because of the necessity of inputting a keyword.
[Reference]
[Patent Document 1]
Publication of Unexamined Utility Model Application No. H2-14150

DISCLOSURE OF INVENTION

According to Patent Document 1, a third party cannot read data; however, a logic circuit needs to be additionally provided to require a keyword or the like.

One embodiment of the present invention provides a memory device, without additional logic circuits, including a memory cell which cannot be easily accessed by a third party and which is always accessible when needed.

The present inventor found the phenomenon of changes in the threshold voltage of a transistor, which uses an oxide semiconductor film for a channel, before ultraviolet (UV) ray irradiation, at the time of UV ray irradiation, and after UV ray irradiation. Then, the present inventor thought that, by utilizing the phenomenon, the aforementioned problem could be solved with use of a memory device including a memory cell provided with such a transistor.

According to a first embodiment of the present invention, a memory device includes a first memory cell and a second memory cell. The first memory cell includes a first transistor and a first memory element; the first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second memory cell includes a second transistor and a second memory element; the second transistor includes a second channel, a second gate electrode, and a second source and drain electrodes; the second gate electrode is part of a second word line or is electrically connected to the second word line; the second channel is formed of an oxide semiconductor film; and one of the second source and drain electrodes is part of a second bit line or is electrically connected to the second bit line and the other is electrically connected to the second memory element. A threshold voltage ($V_{21}$) of the second transistor before ultraviolet ray irradiation is higher than a threshold voltage ($V_1$) of the first transistor; a threshold voltage ($V_{22}$) of the second transistor at the time of ultraviolet ray irradiation is lower than the voltage $V_{21}$; and a threshold voltage ($V_{23}$) of the second transistor after ultraviolet ray irradiation is lower than the voltage $V_{21}$ and higher than the voltage $V_{22}$ and the voltage $V_1$. Data stored in the second memory element is read when a voltage ($V_G$) is applied to the second gate electrode of the second transistor which is being irradiated with ultraviolet rays so that the second transistor is turned on. Note that $V_1 \leqq V_G$ (the voltage $V_G$ is equal to or higher than the voltage $V_1$), and $V_{22} \leqq V_G < V_{23} < V_{21}$ (the voltage $V_G$ is equal to or higher than the voltage $V_{22}$) are satisfied.

In the above embodiment, data stored in the first memory element may be read by applying the voltage $V_G$ to the first gate electrode to turn on the first transistor.

In the above embodiment, the memory device may include a writing circuit, an analog switch, and a third transistor. The third transistor includes a third channel, a third gate electrode, and a third source and drain electrodes, and the third channel is formed of an oxide semiconductor film. An output of the writing circuit is input to the analog switch; an output of the analog switch is input to one of the source electrode and the drain electrode of the second transistor; a writing enable signal is input to one of the third source and drain electrodes; the other of the third source and drain electrodes is connected to a first control terminal of the analog switch; and an inverted signal of the writing enable signal is input to a second control terminal of the analog switch. A threshold voltage of the third transistor before ultraviolet ray irradiation is $V_{31}$; a threshold voltage of the third transistor at the time of ultraviolet ray irradiation is $V_{32}$; and a threshold voltage of the third transistor after ultraviolet ray irradiation is $V_{33}$. Data is written to the second memory element in the following manner: a voltage ($V_A$) is applied to the third gate electrode which is being irradiated with ultraviolet rays so that the third transistor is turned on, the writing enable signal is input to the first control terminal, the output of the writing circuit is input to one of the second source and drain electrodes, and a voltage ($V_W$) is applied to the second gate electrode so that the second transistor is turned on. Note that $V_{32} \leqq V_A < V_{33} < V_{31}$ (the voltage $V_A$ is equal to or higher than the voltage $V_{32}$), and $V_{23} < V_{21} < V_W$ are satisfied.

According to a second embodiment of the present invention, a memory device includes a first memory cell having a first transistor and a first memory element, a second memory cell having a second transistor and a second memory element, and a third transistor. The first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second transistor includes a second channel, a second gate electrode, and a second source and drain electrodes; the second gate electrode is part of a second word line or is electrically connected to the second word line; and one of the second source and drain electrodes is part of a second bit line or is electrically connected to the second bit line and the other is electrically connected to the second memory element. The third transistor includes a third channel, a third gate electrode, and a third source and drain electrodes; the third channel is formed of an oxide semiconductor film; and one of the third source and drain electrodes is electrically connected to the second word line and a selection signal to turn on the second transistor is input to the other of the third source and drain electrodes. A threshold voltage of the third transistor before ultraviolet ray irradiation is $V_{31}$; a threshold voltage of the third transistor at the time of ultraviolet ray irradiation is $V_{32}$; and a threshold voltage of the third transistor after ultraviolet ray irradiation is $V_{33}$. Data is written to and read from the second memory element in the following manner: a voltage ($V_G$) is applied to the third gate electrode which is being irradiated with ultraviolet rays so that the third transistor is turned on, and the selection signal is input to the second gate electrode so that the second transistor is turned on. Note that $V_{32} \leqq V_G < V_{33} < V_{31}$ (the voltage $V_G$ is equal to or higher than the voltage $V_{32}$) is satisfied.

According to a third embodiment of the present invention, a memory device includes a first memory cell having a first transistor and a first memory element, a second memory cell having a second transistor and a second memory element, a third transistor, and a fourth transistor. The first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second transistor includes a second channel, a second gate electrode, and a second source and drain electrodes; the second gate electrode is part of a second word line or is electrically connected to the second word line; and one of the second source and drain electrodes is part of a second bit line or is electrically connected to the second bit line and the other is electrically connected to the second memory element. The third transistor includes a third channel, a third gate electrode, and a third source and drain electrodes; and one of the third source and drain electrodes is electrically connected to the second word line and a selection signal to turn on the second transistor is input to the other of the third source and drain electrodes. The fourth transistor includes a fourth channel, a fourth gate electrode, and a fourth source and drain electrodes; the fourth channel is formed of an oxide semiconductor film; and one of the fourth source and drain electrodes is electrically connected to the third gate electrode and a selection signal to turn on the third transistor is input to the other of the fourth source and drain electrodes. A threshold voltage of the fourth transistor before ultraviolet ray irradiation is $V_{31}$; a threshold voltage of the fourth transistor at the time of ultraviolet ray irradiation is $V_{32}$; and a threshold voltage of the fourth transistor after ultraviolet ray irradiation is $V_{33}$. Data is written to and read from the second memory element in the following manner: a voltage ($V_G$) is applied to the fourth gate electrode which is being irradiated with ultraviolet rays so that the fourth transistor is turned on and thus the third transistor is turned on, and a selection signal to turn on the second transistor is input to the second gate electrode so that the second transistor is turned on. Note that $V_{32} \leqq V_G < V_{33} < V_{31}$ (the voltage $V_G$ is equal to or higher than the voltage $V_{32}$) is satisfied.

The aforementioned memory device according to the second embodiment or the third embodiment may include a decoder, a level shifter, and a buffer, so that one of the third source and drain electrodes is electrically connected to the second word line through the level shifter and the buffer, and the selection signal is input from the decoder to the other of the third source and drain electrodes.

The aforementioned memory device according to the second embodiment or the third embodiment may include a decoder, a level shifter, a buffer, and an address line, so that one of the third source and drain electrodes is electrically connected to the second word line through the decoder, the level shifter, and the buffer, and the selection signal is input from the address line to the other of the third source and drain electrodes.

The first to third embodiments of the present invention provide a memory device including a memory cell, without additional logic circuits, which cannot be accessed by a third party and which is always accessible when needed.

BRIEF DESCRIPTION OF DRAWINGS

In the accompanying drawings.

BEST MODE FOR CARRYING OUT THE INVENTION

Figure 1:
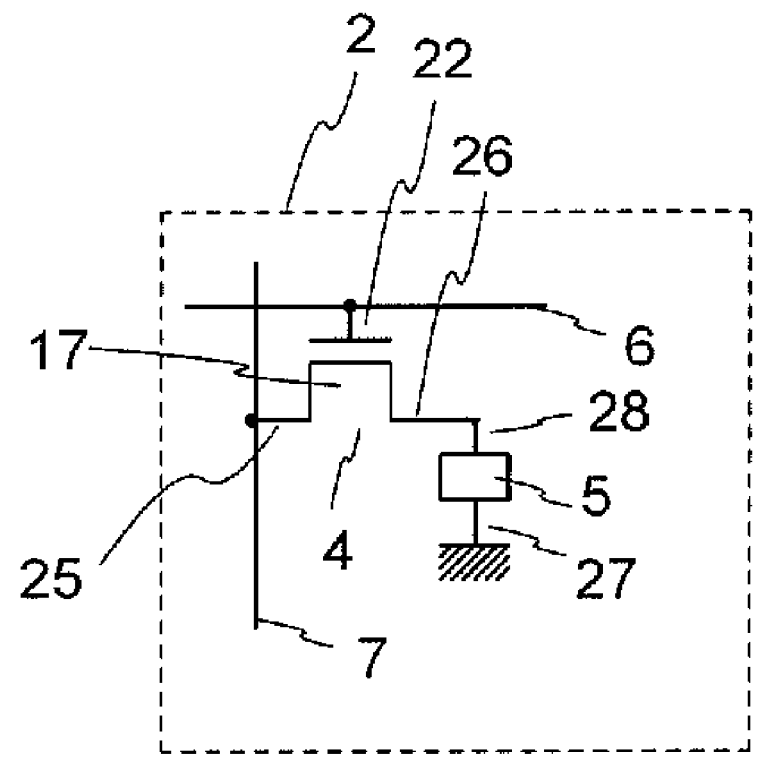
FIG. 1 is a diagram illustrating a memory device of Embodiment 1.
Figure 1:
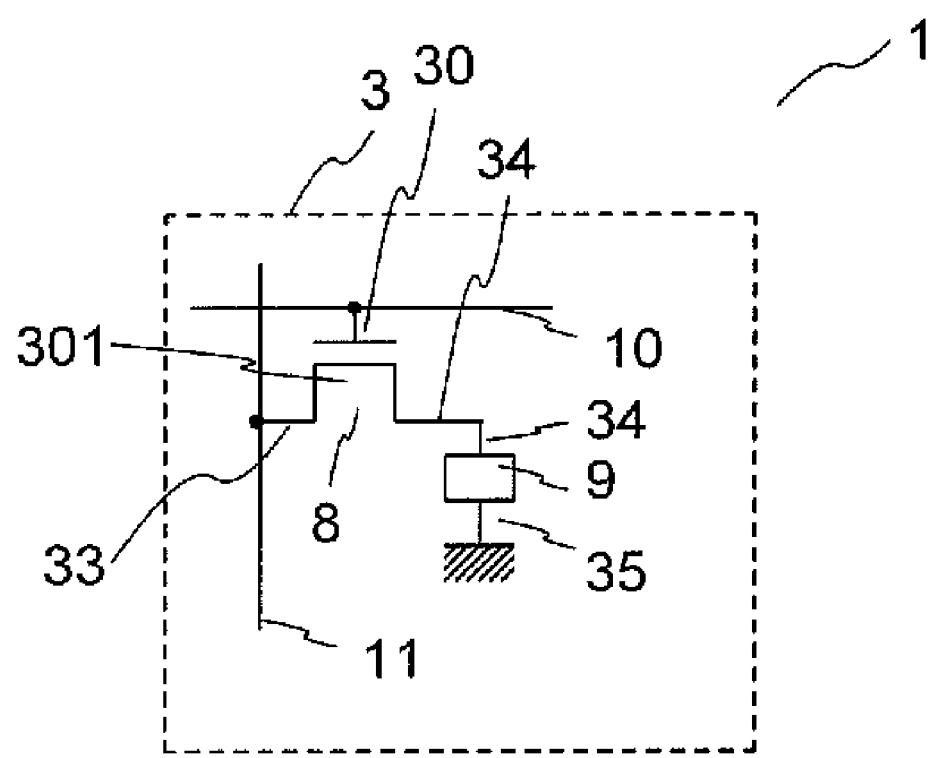

Embodiments of the present invention will be described below. Note that the present invention can be implemented in many different modes, and it is apparent to those skilled in the art that modes and details can be modified in various ways without departing from the spirit and scope of the present invention. Therefore, the present invention is not construed as being limited to the description of the embodiments. Note that in the following description, like portions or portions having a similar function are denoted by like reference numerals in different drawings, and the description thereof is omitted in some cases.

(Embodiment 1)

This embodiment shows a memory device including a first memory cell and a second memory cell, and using an oxide semiconductor film for a second channel of a second transistor provided in the second memory cell. Specifically, the memory device includes a first memory cell and a second memory cell, and the first memory cell includes a first transistor and a first memory element; the first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second memory cell includes a second transistor and a second memory element; the second transistor includes a second channel, a second gate electrode, and a second source and drain electrodes; the second gate electrode is part of a second word line or is electrically connected to the second word line; the second channel is formed of an oxide semiconductor film; and one of the second source and drain electrodes is part of a second bit line or is electrically connected to the second bit line and the other is electrically connected to the second memory element. A threshold voltage ($V_{21}$) of the second transistor before ultraviolet ray irradiation is higher than a threshold voltage ($V_1$) of the first transistor; a threshold voltage ($V_{22}$) of the second transistor at the time of ultraviolet ray irradiation is lower than the voltage $V_{21}$; and a threshold voltage ($V_{23}$) of the second transistor after ultraviolet ray irradiation is lower than the voltage $V_{21}$ and higher than the voltage $V_{22}$ and the voltage $V_1$. A voltage ($V_G$) is applied to the second gate electrode of the second transistor which is being irradiated with ultraviolet rays so that the second transistor is turned on, whereby data stored in the second memory element is read. Note that $V_1 \leq V_G$ ($V_G$ is equal to or higher than $V_1$), and $V_{22} \leq V_G < V_{23} < V_{21}$ (the voltage $V_G$ is equal to or higher than the voltage $V_{22}$) are satisfied.

A memory device 1 includes a first memory cell 2 and a second memory cell 3 (FIG. 1).

The first memory cell 2 includes a first transistor 4 and a first memory element 5. The first transistor 4 includes a first channel 17, a first gate electrode 22, an electrode 25 (one of a first source and drain electrodes), and an electrode 26 (the other of the first source and drain electrodes). The first gate electrode 22 is electrically connected to a first word line 6, the electrode 25 is electrically connected to a first bit line 7, and the electrode 26 is electrically connected to the first memory element 5. A semiconductor film made of silicon is used for the first channel 17. Alternatively, a semiconductor film made of germanium, silicon-germanium, gallium arsenide, silicon carbide, or the like may be used. The threshold voltage of the first transistor 4 is $V_1$. Note that the first gate electrode 22 may be part of the first word line 6, and the electrode 25 may be part of the first bit line 7.

The second memory cell 3 includes a second transistor 8 and a second memory element 9. The second transistor 8 includes a second channel 301, a second gate electrode 30, an electrode 33 (one of a second source and drain electrodes), and an electrode 34 (the other of the second source and drain electrodes). The second gate electrode 30 is electrically connected to a second word line 10, the electrode 33 is electrically connected to a second bit line 11, and the electrode 34 is electrically connected to the second memory element 9. The second channel 301 is formed of an oxide semiconductor film. Note that the second gate electrode 30 may be part of the second word line 10, and the electrode 33 may be part of the second bit line 11.

Figure 2:
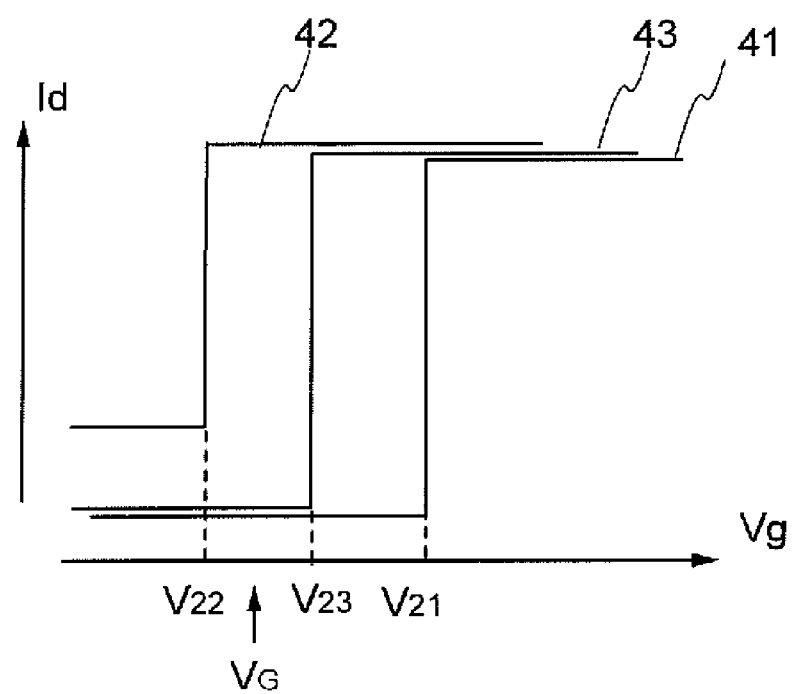
FIG. 2 is a graph showing a change in threshold voltage.

The threshold voltage of the second transistor 8 changes when the second channel 301 is irradiated with ultraviolet (UV) rays (FIG. 2). FIG. 2 schematically shows the relationship between the gate voltage (Vg) and the drain current (Id) of the second transistor 8. A line 41, a line 42, and a line 43 represent the Vg-Id relationship of the second transistor 8 before UV ray irradiation, at the time of UV ray irradiation, and after UV ray irradiation, respectively. The threshold voltage of the second transistor 8 is $V_{21}$ without UV ray irradiation (before UV ray irradiation); $V_{22}$ at the time of UV ray irradiation; and $V_{23}$ after UV ray irradiation. That is, $V_{22} < V_{23} < V_{21}$ is satisfied. In this manner, the transistor using an oxide semiconductor for the channel operates differently from a transistor using a material other than an oxide semiconductor, such as silicon. The memory device 1 is controlled by utilizing this phenomenon.

When data reading is practically performed, the voltage $V_G$ which satisfies $V_{22} \leq V_G < V_{23} < V_{21}$ (the voltage $V_G$ is equal to or higher than the voltage $V_{22}$) is applied to the second gate electrode 30 of the second transistor 8. As a result, the second transistor 8 can be turned on when being irradiated with UV rays, while the second transistor 8 is kept off when not being irradiated with UV rays. Note that the off-current of the second transistor 8 increases at the time of UV ray irradiation due to photo-leakage current.

The irradiated UV rays have a wavelength of 10 nm to 400 nm. As the wavelength of UV rays becomes shorter, the value of $V_{22}$ decreases. As a light source, a commercially available UV lamp, excimer laser, or the like is used. The irradiation intensity depends on the wavelength and the light source, and may be set to about 0.01 to 1.00 mW/cm$^2$.

Next, the operation of the memory device 1 will be described. The first memory element 5 stores data that can be accessed by a third party, and the second memory element 9 stores data that should not be accessed by a third party. The threshold voltage of the first transistor 4 is $V_1$, and $V_1 < V_{23} < V_{21}$ is satisfied. Note that in the case where the first channel 17 is made of silicon, the first channel 17 is doped with an n-type or p-type impurity ion if needed, whereby the threshold voltage $V_1$ of the first transistor 4 is shifted.

1. Reading Data from the First Memory Element 5

Described first is operation in reading data (charges) stored in the first memory element 5. A voltage $V_G$ is applied to the first word line 6 so that the voltage $V_G$ is applied to the first gate electrode 22 of the first transistor 4; thus, the first transistor 4 is turned on. When the first transistor 4 is turned on, data is read from the first memory element 5 to the first bit line 7 through the first transistor 4. Note that $V_1 < V_G < V_{23} < V_{21}$ is satisfied.

On the other hand, when the voltage $V_G$ is applied to the second word line 10, the voltage $V_G$ is applied to the second gate electrode 30 of the second transistor 8. Since the voltage $V_G$ is lower than the threshold voltage ($V_{21}$) of the second transistor 8 which is not irradiated with UV rays, the second transistor 8 is kept off. Therefore, data is not read from the second memory element 9.

2. Reading Data from the First Memory Element 5 and the Second Memory Element 9

Described next is operation in reading data stored in the first memory element 5 and data stored in the second memory element 9. A voltage $V_G$ is applied to the first word line 6 so that the voltage $V_G$ is applied to the first gate electrode 22 of the first transistor 4; thus, the first transistor 4 is turned on. When the first transistor 4 is turned on, data is read from the first memory element 5 to the first bit line 7 through the first transistor 4.

On the other hand, when the voltage $V_G$ is applied to the second word line 10, the voltage $V_G$ is applied to the second gate electrode 30 of the second transistor 8. At this time, the second transistor 8, specifically, the second channel 301 is irradiated with UV rays. The threshold voltage of the second transistor 8 changes from $V_{21}$ to $V_{22}$. Since the voltage $V_G$ is higher than the threshold voltage ($V_{22}$) of the second transistor 8 which is irradiated with UV rays, the second transistor 8 is turned on. When the second transistor 8 is turned on, data is read from the second memory element 9 to the second bit line 11 through the second transistor 8.

After the data is read from the second memory element 9, UV ray irradiation to the second transistor 8 is stopped. The threshold voltage of the second transistor 8 changes from $V_{22}$ to $V_{23}$.

3. Reading Data from the First Memory Element 5 after the Threshold Voltage of the Second Transistor 8 Changes to $V_{23}$ Described is operation in reading data from the first memory element 5 after the threshold voltage of the second transistor 8 changes to $V_{23}$. A voltage $V_G$ is applied to the first word line 6 so that the voltage $V_G$ is applied to the first gate electrode 22 of the first transistor 4; thus, the first transistor 4 is turned on. When the first transistor 4 is turned on, data is read from the first memory element 5 to the first bit line 7 through the first transistor 4.

On the other hand, when the voltage $V_G$ is applied to the second word line 10, the voltage $V_G$ is applied to the second gate electrode 30 of the second transistor 8. Since the voltage $V_G$ is lower than the threshold voltage ($V_{23}$) of the second transistor 8, the second transistor 8 is kept off. Therefore, data is not read from the second memory element 9.

4. Reading Data from the First Memory Element 5 and the Second Memory Element 9 after the Threshold Voltage of the Second Transistor 8 Changes to $V_{23}$ Described next is operation in reading data stored in the first memory element 5 and data stored in the second memory element 9. A voltage $V_G$ is applied to the first word line 6 so that the voltage $V_G$ is applied to the first gate electrode 22 of the first transistor 4; thus, the first transistor 4 is turned on. When the first transistor 4 is turned on, data is read from the first memory element 5 to the first bit line 7 through the first transistor 4.

On the other hand, when the voltage $V_G$ is applied to the second word line 10, the voltage $V_G$ is applied to the second gate electrode 30 of the second transistor 8. At this time, the second transistor 8 is irradiated with UV rays. The threshold voltage of the second transistor 8 changes from $V_{23}$ to $V_{22}$. Since the voltage $V_G$ is higher than the threshold voltage ($V_{22}$) of the second transistor 8 which is irradiated with UV rays, the second transistor 8 is turned on. When the second transistor 8 is turned on, data is read from the second memory element 9 to the second bit line 11 through the second transistor 8. After the data is read from the second memory element 9, UV ray irradiation to the second transistor 8 is stopped.

5. Writing Data to the First Memory Element 5 and the Second Memory Element 9

Described next is operation in writing data to the first memory element 5 and the second memory element 9. A voltage $V_W$ is applied to the first word line 6 so that the voltage $V_W$ is applied to the first gate electrode 22 of the first transistor 4; thus, the first transistor 4 is turned on. When the first transistor 4 is turned on, data is written from the first bit line 7 to the first memory element 5 through the first transistor 4. Note that $V_1 < V_{23} < V_{21} < V_W$ is satisfied.

On the other hand, when the voltage $V_W$ is applied to the second word line 10, the voltage $V_W$ is applied to the second gate electrode 30 of the second transistor 8 so that the second transistor 8 is turned on. When the second transistor 8 is turned on, data is written from the second bit line 11 to the second memory element 9 through the second transistor 8.

Figure 3:
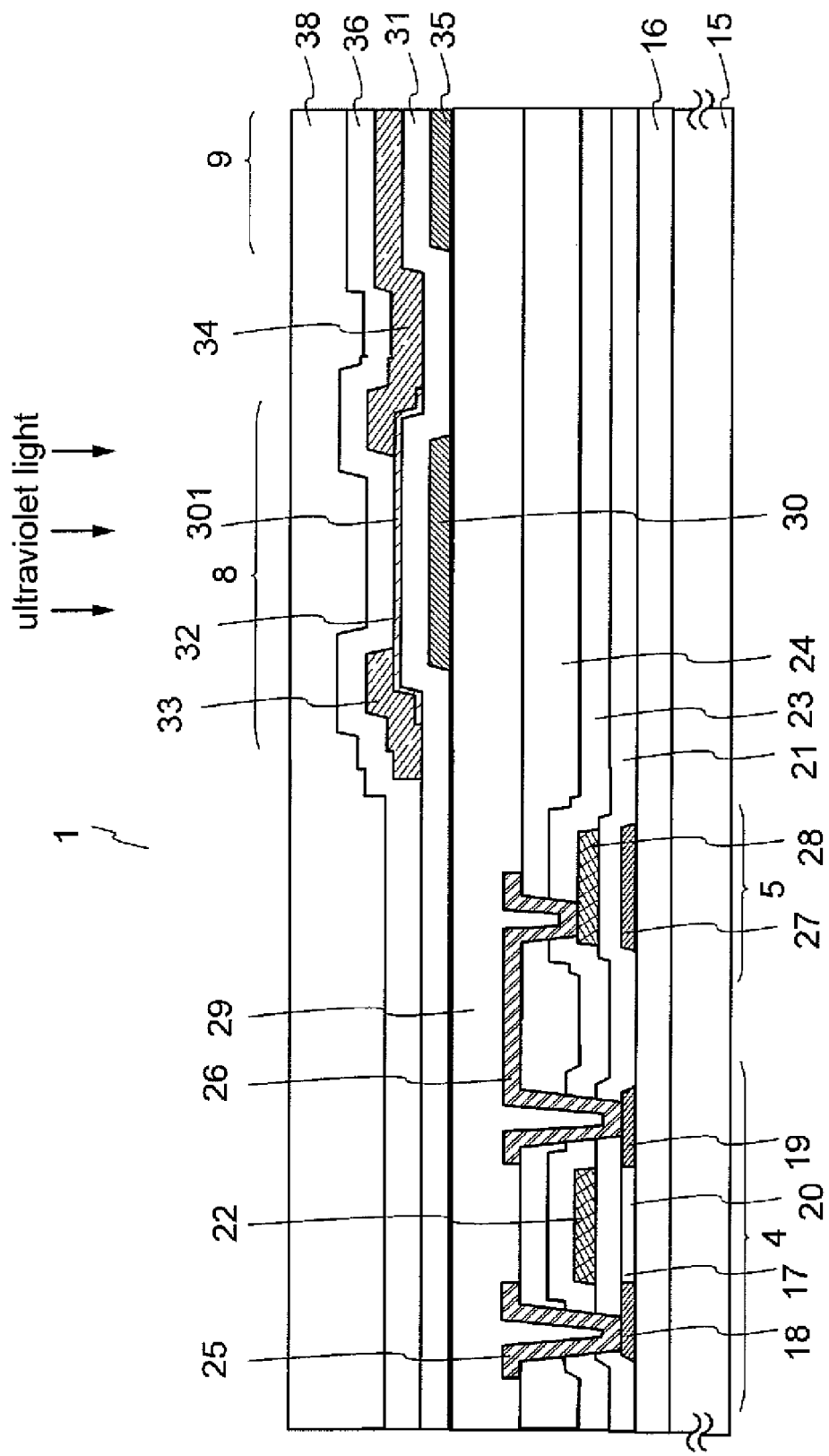
FIG. 3 is a cross-sectional view of a memory device.

Described next are the first transistor 4, the second transistor 8, the first memory element 5, and the second memory element 9 that are included in the memory device 1 (FIG. 3). FIG. 3 is a cross-sectional view of the first transistor 4, the second transistor 8, the first memory element 5, and the second memory element 9.

(First Transistor 4)

The first transistor 4 includes a silicon film 20 having the first channel 17, a first gate insulating film 21, the first gate electrode 22, the electrode 25 (one of the first source and drain electrodes), and the electrode 26 (the other of the first source and drain electrodes). A region 18 is one of a first source and drain regions, and a region 19 is the other of the first source and drain regions.

The first transistor 4 is provided over an insulating film 16 which is a base film over the substrate 15. The insulating film 16 prevents impurities contained in the substrate 15, such as metal ions, from entering the first transistor 4, the first memory element 5, the second transistor 8, and the second memory element 9. The silicon film 20 is provided over the insulating film 16. The first gate insulating film 21 is provided over the silicon film 20. The first gate electrode 22 is provided over the first gate insulating film 21. The electrode 25 is provided over the silicon film 20 so as to be in contact with the region 18, and the electrode 26 is provided over the silicon film 20 so as to be in contact with the region 19. Note that although a top-gate thin film transistor (TFT) is shown as the first transistor 4, the first transistor 4 may be a bottom-gate TFT.

The first gate electrode 22 is electrically connected to the first word line 6 (not illustrated). Alternatively, the first gate electrode 22 may be part of the first word line 6.

The electrode 25 is electrically connected to the first bit line 7 (not illustrated). Alternatively, the electrode 25 may be part of the first bit line 7.

A light-shielding film may be provided over the first transistor 4 (e.g., over an insulating film 29), so that the first transistor 4 is not irradiated with UV rays when the second transistor 8 is irradiated with UV rays.

(First Memory Element 5)

The first memory element 5 includes an electrode 27, the first gate insulating film 21, and an electrode 28.

The first memory element 5 is provided over the insulating film 16 which is a base film over the substrate 15. The electrode 27 is provided over the insulating film 16. The first gate insulating film 21 is provided over the electrode 27. The electrode 28 is provided over the first gate insulating film 21. The electrode 26 is provided to be in contact with the electrode 28. The electrode 27 may be grounded. The structure of the first memory element 5 is not limited to the above one, and may be other structures.

In addition, an insulating film 23 is provided as a passivation film over the first gate electrode 22 and the electrode 28. An insulating film 24 is provided as a passivation film and a planarization film over the insulating film 23. The electrode 25 and the electrode 26 are provided also over the insulating film 24, and are in contact with the region 18 and the region 19 through contact holes provided in the insulating film 24, the insulating film 23, and the first gate insulating film 21. The electrode 26 is also in contact with the electrode 28 through a contact hole provided in the insulating film 24 and the insulating film 23. The insulating film 29 is provided as a passivation film and a planarization film over the electrode 25, the electrode 26, and the insulating film 24.

(Second Transistor 8)

The second transistor 8 includes the second gate electrode 30, a second gate insulating film 31, an oxide semiconductor film 32, the electrode 33 (one of the second source and drain electrodes), and the electrode 34 (the other of the second source and drain electrodes).

The second transistor 8 is provided over the insulating film 29. The second gate electrode 30 is provided over the insulating film 29. The oxide semiconductor film 32 is provided over the second gate electrode 30. The electrode 33 and the electrode 34 are provided on and in contact with the oxide semiconductor film 32. An insulating film 36 is provided as a passivation film over the electrode 33, the electrode 34, the oxide semiconductor film 32, and the second gate insulating film 31. Note that although a bottom-gate thin film transistor is shown as the second transistor 8, the second transistor 8 may be a top-gate thin film transistor.

The second gate electrode 30 is electrically connected to the second word line 10. Alternatively, the second gate electrode 30 may be part of the second word line 10 (not illustrated).

The electrode 33 is electrically connected to the second bit line 11. Alternatively, the electrode 33 may be part of the second bit line 11 (not illustrated).

Note that the oxide semiconductor film 32 including the second channel 301 is irradiated with UV rays as illustrated in FIG. 3.

(Second Memory Element 9)

The second memory element 9 includes an electrode 35, the second gate insulating film 31, and the electrode 34.

The second memory element 9 is provided over the insulating film 29. The electrode 35 is provided over the insulating film 29. The second gate insulating film 31 is provided over the electrode 35. The electrode 34 is provided over the second gate insulating film 31. The electrode 35 may be grounded (not illustrated).

In addition, an insulating film 38 is provided as a passivation film and a planarization film over the insulating film 36.

Next, a material or the like of each component will be described.

The substrate 15 has heat resistance high enough to withstand subsequent heat treatment. As the substrate 15, a glass substrate such as a barium borosilicate glass substrate or an aluminoborosilicate glass substrate is used. Alternatively, the substrate 15 may be a substrate made of an insulator, such as a ceramic substrate, a quartz substrate, a sapphire substrate, or a crystallized glass substrate. Further alternatively, it is possible to use a plastic film made of polyethylene terephthalate, polyimide, an acrylic resin, polycarbonate, polypropylene, polyester, polyvinyl chloride, or the like as long as it has heat resistance high enough to withstand subsequent heat treatment.

As the insulating film 16, a silicon oxide film, a silicon nitride film, a silicon oxynitride film, or the like is used. The thickness of the insulating film 16 may be set to 10 nm to 200 nm.

The silicon film 20 is a single crystal silicon film or a crystalline silicon film. The thickness of the silicon film 20 may be set to 2 nm to 200 nm. The silicon film 20 contains an n-type or p-type impurity element, and regions containing the impurity element serve as the region 18 and the region 19. A region between the region 18 and the region 19 serves as the first channel 17. The silicon film 20 may include an LDD region as needed. A film made of germanium, silicon-germanium, gallium arsenide, silicon carbide, or the like may be used instead of the silicon film 20.

The electrode 27 may be formed using the same silicon film as the silicon film 20. The thickness of the electrode 27 may be set to 2 nm to 200 nm. Note that the electrode 27 contains an n-type or p-type impurity to have conductivity. Instead of the silicon film, a conductive film such as a metal film may be used for the electrode 27.

The first gate insulating film 21 is formed as a single layer or stacked layers of any of a silicon oxide film, a silicon nitride film, a silicon oxynitride film, a silicon nitride oxide film, an aluminum oxide film, a $Y_2O_3$ film, and $HfO_2$ film. The thickness of the first gate insulating film 21 may be set to 10 nm to 500 nm.

The first gate electrode 22 is formed as a single layer or stacked layers of a metal material such as molybdenum, titanium, chromium, tantalum, tungsten, aluminum, copper, neodymium, or scandium, or an alloy material containing any of these materials as a main component. The thickness of the first gate electrode 22 may be set to 10 nm to 200 nm.

The electrode 28 is formed using the same film as the first gate electrode 22. Alternatively, a conductive film different from that of the first gate electrode 22 may be used for the electrode 28.

The electrode 25 and the electrode 26 are formed as a single layer or stacked layers of a metal material such as molybdenum, titanium, chromium, tantalum, tungsten, aluminum, copper, neodymium, or scandium, or an alloy material containing any of these materials as a main component. The thickness of each of the electrode 25 and the electrode 26 may be set to 100 nm to 500 nm.

The insulating film 23 is formed as a single layer or stacked layers of any of a silicon oxynitride film, a silicon nitride oxide film, an aluminum oxide film, a $Y_2O_3$ film, and $HfO_2$ film. The thickness of the insulating film 23 may be set to 10 nm to 200 nm.

As the insulating films 24 and 29, a silicon oxide film, a silicon nitride film, a silicon oxynitride film, or the like is used. It is preferable that the insulating films 24 and 29 do not contain hydrogen, hydroxyl groups, or moisture. The thickness of each of the insulating films 24 and 29 may be set to 10 nm to 1 μm.

The second gate electrode 30 and the electrode 35 are formed as a single layer or stacked layers of a metal material such as molybdenum, titanium, chromium, tantalum, tungsten, aluminum, copper, neodymium, or scandium, or an alloy material containing any of these materials as a main component. It is preferable that the second gate electrode 30 and the electrode 35 do not contain hydrogen, hydroxyl groups, or moisture. The thickness of each of the second gate electrode 30 and the electrode 35 may be set to 10 nm to 200 nm.

The second gate insulating film 31 is formed as a single layer or stacked layers of any of a silicon oxide film, a silicon nitride film, a silicon oxynitride film, a silicon nitride oxide film, an aluminum oxide film, a hafnium silicate ($HfSiO_x$) film, an $HfSi_xO_y$ film to which N is added, a hafnium aluminate ($HfAlO_x$) film, a hafnium oxide film, and an yttrium oxide film. The gate leakage can be reduced by using a high-k material such as hafnium silicate ($HfSiO_x$), $HfSi_xO_y$ to which N is added, hafnium aluminate ($HfAlO_x$), hafnium oxide, or yttrium oxide. It is preferable that the second gate insulating film 31 do not contain hydrogen, hydroxyl groups, or moisture. The thickness of the second gate insulating film 31 may be set to 10 nm to 500 nm.

The second gate insulating film 31 may contain a halogen element (e.g., fluorine or chlorine) at a concentration of about $5 \times 10^{18}$ atoms/cm$^3$ to $1 \times 10^{20}$ atoms/cm$^3$. The halogen element contributes to elimination of impurities such as hydrogen, moisture, hydroxyl groups, or hydride which can exist in the oxide semiconductor film 32, or at the interface between the second gate insulating film 31 and the oxide semiconductor film 32. For example, in the case where a stacked film of a silicon nitride film and a silicon oxide film is used as the second gate insulating film 31, the silicon oxide film containing a halogen element at the aforementioned concentration may be provided as a film which is in contact with the oxide semiconductor film 32. The silicon nitride film prevents impurities such as hydrogen, moisture, hydroxyl groups, or hydride (also referred to as a hydrogen compound) from entering the silicon oxide film.

The oxide semiconductor film 32 is an amorphous oxide semiconductor film or a crystalline oxide semiconductor film, and for example, an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. The thickness of the oxide semiconductor film 32 may be set to 2 nm to 200 nm. The threshold voltage can be controlled by the kind and composition of the oxide semiconductor film 32.

It is preferable that the oxide semiconductor film 32 do not contain hydrogen, hydroxyl groups, or moisture. Specifically, hydrogen is contained at a concentration of $5 \times 10^{19}$ atoms/cm$^3$ or less, preferably $5 \times 10^{18}$ atoms/cm$^3$ or less, and more preferably less than $5 \times 10^{16}$ atoms/cm$^3$. The carrier concentration of the oxide semiconductor film 32 at 300 K is $5 \times 10^{14}$ atoms/cm$^3$ or less, preferably $1 \times 10^{14}$ atoms/cm$^3$ or less, more preferably $5 \times 10^{12}$ atoms/cm$^3$ or less, and still more preferably $1 \times 10^{12}$ atoms/cm$^3$ or less. That is, the carrier concentration of the oxide semiconductor film is close to zero. Furthermore, the energy gap is 2 eV or more, preferably 2.5 eV or more, and more preferably 3 eV or more. Note that the hydrogen concentration of the oxide semiconductor film can be measured by secondary ion mass spectrometry (SIMS). The carrier density can be measured by the Hall effect measurement.

It is known that hydrogen is a donor in an oxide semiconductor and is one factor causing an oxide semiconductor to be an n-type oxide semiconductor. Accordingly, an intrinsic (i-type) oxide semiconductor can be obtained by removing hydrogen from an oxide semiconductor and purifying the oxide semiconductor such that an impurity other than the main component of the oxide semiconductor is contained therein as little as possible. It is preferable that a purified i-type (intrinsic) semiconductor, or a semiconductor close thereto, be obtained not by adding an impurity but by removing an impurity such as hydrogen or moisture as much as possible. The Fermi level (Ef) of the oxide semiconductor from which an impurity is removed can be made at the same level as the intrinsic Fermi level (Ei).

The second transistor 8 including the oxide semiconductor film 32 has a low off-current even when a negative potential (a reverse bias) is applied to the second gate electrode 30. This is because the concentration of minority carriers (hole concentration) affecting the off-current is low due to a low carrier concentration.

For example, even when the second transistor 8 has a channel width W of $1 \times 10^4$ μm and a channel length of 3 μm, an off-current of $10^{-13}$ A or less and a subthreshold value (S value) of 0.1 V/dec. can be obtained (the thickness of the second gate insulating film 31: 100 nm).

When the oxide semiconductor is purified so that impurities other than the main component of the oxide semiconductor are contained as little as possible, the second transistor 8 can operate in a good manner, particularly, the off-current of the second transistor 8 can be reduced.

In the case where the band gap (Eg) of an oxide semiconductor is 3.15 eV, the electron affinity ($\chi$) is said to be 4.3 eV. For example, when titanium (Ti) is used for the electrode 33 and the electrode 34, the work function of Ti is substantially equal to the electron affinity ($\chi$) of the oxide semiconductor. In that case, a Schottky barrier for electrons is not formed at the interface between the metal (Ti) and the oxide semiconductor. That is, electrons are injected from Ti to the oxide semiconductor film 32 even when an n-type impurity is not added to the oxide semiconductor film 32.

The electrode 33 and the electrode 34 are formed as a single layer or stacked layers of a metal material such as molybdenum, titanium, chromium, tantalum, tungsten, aluminum, copper, neodymium, or scandium, or an alloy material containing any of these materials as a main component. It is preferable that the electrode 33 and the electrode 34 do not contain hydrogen, hydroxyl groups, or moisture. The thickness of each of the electrode 33 and the electrode 34 may be set to 10 nm to 500 nm.

The insulating film 36 is an oxide insulating film, for example, a silicon oxide film. It is preferable that the insulating film 36 do not contain hydrogen, hydroxyl groups, or moisture. The thickness of the insulating film 36 may be set to 10 nm to 200 nm. Note that instead of the silicon oxide film, a silicon oxynitride film, an aluminum oxide film, an aluminum oxynitride film, or the like can be used.

The insulating film 36 may contain a halogen element (e.g., fluorine or chlorine) at a concentration of about $5 \times 10^{18}$ atoms/cm$^3$ to $1 \times 10^{20}$ atoms/cm$^3$. The halogen element contributes to elimination of impurities such as hydrogen, moisture, hydroxyl groups, or hydride which can exist in the oxide semiconductor film 32, or at the interface between the insulating film 36 and the oxide semiconductor film 32.

Note that the threshold voltage can be controlled by providing a so-called back gate over the second gate electrode 30 to be in direct contact with the insulating film 36.

The insulating film 38 is, for example, a silicon oxide film or a silicon nitride film. It is preferable that the insulating film 38 do not contain hydrogen, hydroxyl groups, or moisture. The thickness of the insulating film 38 may be set to 100 nm to 1 μm.

The first word line 6, the second word line 10, the first bit line 7, and the second bit line 11 can be typically made of a conductive material, such as an element selected from aluminum, copper, titanium, tantalum, tungsten, molybdenum, chromium, neodymium, or scandium, an alloy containing any of these elements, or a compound (e.g., an oxide or a nitride) containing any of these elements. Alternatively, the first word line 6, the second word line 10, the first bit line 7, and the second bit line 11 may be made of a light-transmitting conductive material such as indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. A stacked structure containing any of these materials can also be used.

Next, a method for manufacturing the memory device 1 illustrated in FIG. 3 will be described. The insulating film 16 is formed over the substrate 15 by CVD or sputtering.

A silicon film is formed over the insulating film 16 by CVD or sputtering, and then etched using a resist mask formed by a photolithography process, whereby the silicon film 20 is formed. A silicon film used as the electrode 27 may be formed at the same time as the formation of the silicon film 20.

In the case where the silicon film 20 is a single crystal silicon film, an amorphous silicon film is formed and then irradiated with a continuous-wave laser beam or a laser beam with a repetition rate of 1 MHz to 10 MHz to be single crystallized. Alternatively, a single crystal silicon film may be transferred from a single crystal silicon substrate onto the insulating film 16.

In the case where the silicon film 20 is a crystalline silicon film, an amorphous silicon film is formed and then irradiated with an excimer laser beam to be crystallized. Alternatively, after a metal film such as a Ni film is formed over an amorphous silicon film, the amorphous silicon film may be thermally crystallized. Further alternatively, a crystalline silicon film may be formed by CVD. The silicon film 20 may be doped with an n-type or p-type impurity ion, whereby the threshold voltage $V_1$ of the first transistor 4 is shifted.

In the case where a silicon film is not used for the electrode 27, a conductive film such as a metal film is formed over the insulating film 16 and then etched using a resist mask formed by a photolithography process, whereby the electrode 27 is formed.

Next, the first gate insulating film 21 is formed over the silicon film 20 by CVD or sputtering.

A conductive film is formed over the first gate insulating film 21 by sputtering, and then etched using a resist mask formed by a photolithography process, whereby the first gate electrode 22 and the electrode 28 are formed. Note that in the case where the electrode 27 is formed using the same film as the silicon film 20, an n-type or p-type impurity ion is added to the silicon film 20 to impart conductivity before the formation of the electrode 28.

An n-type or p-type impurity element is added to the silicon film 20 with the first gate electrode 22 used as a mask, whereby the region 18 and the region 19 are formed in the silicon film 20. A region which is not doped with the n-type or p-type impurity element serves as the first channel 17.

The insulating film 23 is formed over the first gate electrode 22 by CVD or sputtering. The insulating film 24 is formed over the insulating film 23 by CVD, sputtering, or coating.

Then, etching is performed using a resist mask formed by a photolithography process, whereby the openings are formed in the insulating film 24, the insulating film 23, and the gate insulating film 21. The openings reach the region 18, the region 19, and the electrode 28.

A conductive film is formed over the insulating film 24 and then etched using a resist mask formed by a photolithography process, whereby the electrode 25 and the electrode 26 are formed.

The insulating film 29 is formed over the electrode 25 and the electrode 26 by CVD, sputtering, or coating. Note that the insulating film 29 is preferably formed by sputtering in order that a large amount of hydrogen is not contained in the insulating film 29.

Description is made on the case where a silicon oxide film is formed as the insulating film 29, for example. A silicon oxide film is formed with use of a silicon semiconductor target while introducing a sputtering gas containing a high-purity oxygen from which hydrogen, water, hydroxyl groups, hydride (also referred to as a hydrogen compound), or the like is removed. The deposition may be performed at room temperature or performed while heating the substrate 15.

Alternatively, a silicon oxide film is formed by RF sputtering under the following conditions: quartz (preferably, synthetic quartz) is used; the substrate temperature is 108° C.; the distance between the target and the substrate (T-S distance) is 60 mm; the pressure is 0.4 Pa; the high-frequency power is 1.5 kW; and the atmosphere is oxygen and argon (flow rate ratio of oxygen to argon is 25 sccm:25 sccm=1:1). Note that a silicon target may be used instead of quartz (preferably, synthetic quartz). Note that oxygen or a mixed gas of oxygen and argon is used as a sputtering gas.

Note that the insulating film 29 is preferably formed while removing moisture remaining in a deposition chamber. This is for preventing hydrogen, water, hydroxyl groups, hydride, or the like from being contained in the insulating film 29.

In order to remove moisture remaining in the deposition chamber, an adsorption type vacuum pump is preferably used. For example, a cryopump, an ion pump, or a titanium sublimation pump is preferably used. As an evacuation unit, a turbo pump provided with a cold trap may be used. From the deposition chamber which is evacuated with a cryopump, for example, hydrogen, water, hydroxyl groups, or hydride is removed, resulting in a reduction in the concentration of an impurity contained in the insulating film 29 formed in the deposition chamber.

As the sputtering gas, it is preferable to use a high-purity gas from which an impurity such as hydrogen, water, hydroxyl groups, or hydride is removed to a concentration of a few ppm or a few ppb.

Examples of sputtering include an RF sputtering in which a high-frequency power source is used for a sputtering power source, a DC sputtering, and a pulsed DC sputtering in which a bias is applied in a pulsed manner. The RF sputtering is mainly used for forming an insulating film, and the DC sputtering is mainly used for forming a metal film.

Furthermore, there is also a multi-source sputtering apparatus in which a plurality of targets of different materials can be set. With the multi-source sputtering apparatus, films of different materials can be formed to be stacked in the same chamber, or plural kinds of materials can be deposited by electric discharge at the same time in the same chamber.

There are also a sputtering apparatus provided with a magnet system inside the chamber and used for a magnetron sputtering, and a sputtering apparatus used for an ECR sputtering in which plasma generated with use of microwaves is used without using glow discharge.

As a deposition method using sputtering, there are also reactive sputtering in which a target substance and a sputtering gas component are chemically reacted with each other during deposition to form a thin compound film thereof, and bias sputtering in which voltage is also applied to a substrate during deposition.

For the sputtering in this specification, the aforementioned sputtering apparatuses and sputtering methods can be employed as appropriate.

In the case where a silicon nitride film and a silicon oxide film are stacked as the insulating film 29, the silicon nitride film and the silicon oxide film are formed using a common silicon target in the same deposition chamber. First, the silicon nitride film is formed with use of a silicon target mounted on the deposition chamber while introducing a sputtering gas containing nitrogen. Then, the gas is changed to a sputtering gas containing oxygen and the silicon oxide film is formed with use of the same silicon target. The silicon nitride film and the silicon oxide film can be formed successively without being exposed to air, which makes it possible to prevent adsorption of impurities such as hydrogen, water, hydroxyl groups, or hydride on a surface of the silicon nitride film.

A conductive film is formed over the insulating film 29 and then etched using a resist mask formed by a photolithography process, whereby the second gate electrode 30 and the electrode 35 are formed. The conductive film is preferably formed by sputtering in order that hydrogen, hydroxyl groups, or moisture is not contained in the conductive film. An end portion of the second gate electrode 30 preferably has a tapered shape so as to improve the coverage with the second gate insulating film 31 stacked thereover.

The second gate insulating film 31 is formed over the second gate electrode 30 and the electrode 35. The second gate insulating film 31 is preferably formed by sputtering in order that hydrogen, hydroxyl groups, or moisture is not contained in the second gate insulating film 31. In order to achieve this, as pretreatment of the deposition, the substrate 15 is preferably preheated in a preheating chamber of the sputtering apparatus, so that impurities such as hydrogen, water, hydroxyl groups, or hydride that are adsorbed on the substrate 15 are eliminated and removed. Note that the temperature of the preheating is 100° C. or more and 400° C. or less, preferably 150° C. or more and 300° C. or less. Note that as an evacuation unit, a cryopump is preferably provided in the preheating chamber. Note also that this preheating treatment is not necessarily performed.

For example, in the case where a silicon oxide film is formed as the second gate insulating film 31, a silicon target or a quartz target is used as a target and oxygen or a mixed gas of oxygen and argon is used as a sputtering gas.

An oxide semiconductor film is formed over the second gate insulating film 31 by sputtering. Before the oxide semiconductor film is formed by sputtering, it is preferable to perform reverse sputtering in which an argon gas is introduced and plasma is generated, so that dust on a surface of the second gate insulating film 31 is removed. The reverse sputtering refers to a method in which, without application of voltage to a target side, a high-frequency power source is used for application of voltage to a substrate side in an argon atmosphere and plasma is generated in the vicinity of the substrate to modify a surface. Note that a nitrogen atmosphere, a helium atmosphere, an oxygen atmosphere, or the like may be used instead of an argon atmosphere.

A target including the oxide semiconductor is used. For example, it is possible to use a target of a metal oxide containing zinc oxide as a main component. Another example of a metal oxide target is a metal oxide target containing In, Ga, and Zn (with a composition ratio of $In_2O_3:Ga_2O_3:ZnO=1:1:1$ [mol %] or $In:Ga:Zn=1:1:0.5$ [atom %]). As the metal oxide target including In, Ga, and Zn, a target having a composition ratio of $In:Ga:Zn=1:1:1$ [atom %] or a composition ratio of $In:Ga:Zn=1:1:2$ [atom %] can also be used. The filling rate of the metal oxide target is 90% to 100%, preferably 95% to 99.9%. By using a metal oxide target with high filling rate, the deposited oxide semiconductor film has high density. It is also possible to use a target including $SiO_2$ at 2 wt % to 10 wt %.

The oxide semiconductor film is formed in a rare gas (typically argon) atmosphere, an oxygen atmosphere, or an atmosphere of a rare gas (typically argon) and oxygen.

As the sputtering gas, it is preferable to use a high-purity gas from which an impurity such as hydrogen, water, hydroxyl groups, or hydride is removed to a concentration of a few ppm or a few ppb.

The oxide semiconductor film is formed as follows: the substrate 15 is held in the deposition chamber with pressure reduced, a sputtering gas from which impurities such as hydrogen, water, hydroxyl groups, or hydride are removed is introduced while removing residual moisture in the chamber, and the above-described target is used. In order to remove moisture remaining in the deposition chamber, an adsorption type vacuum pump is preferably used. For example, a cryopump, an ion pump, or a titanium sublimation pump is preferably used. As an evacuation unit, a turbo pump provided with a cold trap may be used. From the deposition chamber which is evacuated with a cryopump, for example, a hydrogen atom or a compound containing a hydrogen atom, such as water ($H_2O$), (more preferably, also a compound containing a carbon atom), is removed, resulting in a reduction in the concentration of an impurity contained in the oxide semiconductor film formed in the deposition chamber. The substrate 15 may be heated to, for example, less than 400° C. when the oxide semiconductor film is formed.

An example of the deposition condition is as follows: the temperature of the substrate 15 is room temperature, the distance between the substrate and the target is 110 mm, the pressure is 0.4 Pa, the direct current (DC) power is 0.5 kW, and the atmosphere is an atmosphere containing oxygen and argon (the flow rate ratio of oxygen to argon is 15 sccm:30 sccm). It is preferable to use a pulsed direct current (DC) power because powder substances (also referred to as particles or dust) generated in the deposition can be reduced and the film thickness can be uniform. The oxide semiconductor film preferably has a thickness of 2 nm to 200 nm. Since appropriate thickness depends on an oxide semiconductor material used, the thickness can be determined as appropriate depending on the material.

Then, the oxide semiconductor film is etched using a resist mask formed by a photolithography process, whereby the oxide semiconductor film 32 is formed. Note that the oxide semiconductor film may be etched by either dry etching or wet etching, or both dry etching and wet etching.

As the etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, parallel plate RIE (reactive ion etching) or ICP (inductively coupled plasma) etching can be used.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. Alternatively, ITO07N (produced by KANTO CHEMICAL CO., INC.) may be used.

The oxide semiconductor film 32 may be subjected to heat treatment. The temperature of the heat treatment is 400° C. to 750° C., preferably 400° C. or more and less than the strain point of the substrate. Through the heat treatment, the oxide semiconductor film 32 can be dehydrated or dehydrogenated. For example, the oxide semiconductor film 32 is subjected to heat treatment in an electric furnace in a nitrogen atmosphere at 450° C. for one hour, and then the oxide semiconductor film is not exposed to air. Accordingly, hydrogen, water, hydroxyl groups, hydride, or the like can be prevented from reentering the oxide semiconductor film.

Note that a heat treatment apparatus is not limited to the electrical furnace, and may include a device for heating an object by heat conduction or heat radiation from a heating element such as a resistance heating element. For example, it is possible to use an RTA (rapid thermal anneal) apparatus such as a GRTA (gas rapid thermal anneal) apparatus or an LRTA (lamp rapid thermal anneal) apparatus. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. The GRTA apparatus is an apparatus for performing heat treatment using a high-temperature gas. As the gas, an inert gas which does not react with an object by heat treatment, such as nitrogen or a rare gas such as argon, is used.

The heat treatment may be performed using the GRTA. With use of the GRTA, the heat treatment is performed for a few minutes in an inert gas atmosphere heated to a high temperature of 650° C. to 700° C. With the GRTA, the heat treatment can be performed at high temperature in a short period of time.

In the heat treatment, it is preferable that hydrogen, water, hydroxyl groups, hydride, or the like be not contained in nitrogen or a rare gas such as helium, neon, or argon. It is also preferable that the purity of nitrogen or the rare gas such as helium, neon, or argon which is introduced into the heat treatment apparatus be set to 6N (99.9999%) or more, preferably 7N (99.99999%) or more (that is, the impurity concentration is 1 ppm or less, preferably 0.1 ppm or less).

Depending on the conditions of the heat treatment or the material of the oxide semiconductor film 32, the oxide semiconductor film may be crystallized to be a microcrystalline film or a polycrystalline film. For example, the oxide semiconductor film may be crystallized to be a microcrystalline oxide semiconductor film having a degree of crystallization of 90% or more, or 80% or more. Further, depending on the conditions of the heat treatment or the material of the oxide semiconductor film, the oxide semiconductor film may become an amorphous oxide semiconductor film containing no crystalline component. Moreover, the oxide semiconductor film may become an oxide semiconductor film in which a microcrystalline portion (with a grain diameter of 1 nm to 20 nm, typically 2 nm to 4 nm) is mixed into an amorphous oxide semiconductor.

Note that it is preferable that reverse sputtering be performed before the formation of a conductive film in a subsequent step so as to remove a resist residue or the like that is attached to surfaces of the oxide semiconductor film 32 and the second gate insulating film 31.

A conductive film is formed by sputtering over the oxide semiconductor film 32 and the second gate insulating film 31. Before the formation of the conductive film, the aforementioned pretreatment is preferably performed in order that hydrogen, hydroxyl groups, or moisture is contained in the conductive film as little as possible. The conductive film is etched using a resist mask formed by a photolithography process, whereby the electrode 33 and the electrode 34 are formed.

Then, plasma treatment using a gas such as $N_2O$, $N_2$, or Ar is performed to remove water or the like adsorbed on an exposed surface of the oxide semiconductor film 32. Alternatively, plasma treatment may be performed using a mixed gas of oxygen and argon.

After the plasma treatment, the insulating film 36 serving as a passivation film is formed on and in contact with the oxide semiconductor film 32 without exposure to the air. The insulating film 36 is in contact with the oxide semiconductor film 32 in a region where the oxide semiconductor film 32 is not in contact with the electrode 33 and the electrode 34.

In the case where a silicon oxide film is used as the insulating film 36, the substrate 15 is heated to room temperature or a temperature of less than 100° C., and a silicon oxide film including defects is formed with use of a silicon semiconductor target while introducing a sputtering gas containing a high-purity oxygen from which hydrogen and moisture are removed.

For example, a silicon oxide film is formed by pulsed DC sputtering under the following condition: a boron-doped silicon target which has a purity of 6N (the resistivity is 0.01 Ωcm) is used; the distance between the substrate and the target (T-S distance) is 89 mm; the pressure is 0.4 Pa, the direct current (DC) power is 6 kW, and the atmosphere is oxygen (the flow rate ratio of oxygen is 100%). Note that quartz (preferably, synthetic quartz) may be used instead of a silicon target. Note that oxygen or a mixed gas of oxygen and argon is used as a sputtering gas.

In that case, the insulating film 36 is preferably formed while removing moisture remaining in the treatment chamber. This is for preventing hydrogen, hydroxyl groups, or moisture from being contained in the oxide semiconductor film 32 and the insulating film 36. In order to remove moisture remaining in the treatment chamber, an adsorption type vacuum pump is preferably used.

In addition, heat treatment may be performed at 100° C. to 400° C. in a state where the insulating film 36 is in contact with the oxide semiconductor film 32. Since the insulating film 36 includes many defects, an impurity such as hydrogen, moisture, hydroxyl groups, or hydride contained in the oxide semiconductor film 32 is diffused into the insulating film 36 by the heat treatment, resulting in a further reduction in the impurity contained in the oxide semiconductor film 32.

As described above, when the oxide semiconductor film 32 is formed while removing moisture remaining in the reaction atmosphere, the concentration of hydrogen and hydride in the oxide semiconductor film 32 can be reduced. Thus, the oxide semiconductor film 32 can be stabilized.

The insulating film 38 is formed as a planarization film over the insulating film 36. As the insulating film 38, for example, a silicon nitride film is formed in the following manner: the substrate 15 is heated to a temperature of 100° C. to 400° C.; a silicon semiconductor target is used, and a sputtering gas containing a high-purity nitrogen from which hydrogen and moisture are removed is introduced. In that case also, like the insulating film 36, the insulating film 38 is preferably formed while removing moisture remaining in the treatment chamber.

The first gate electrode 22 may be used for the first word line 6, or the first word line 6 may be formed over the insulating film 38 with use of a conductive film. Further, the second gate electrode 30 may be used for the second word line 10, or the second word line 10 may be formed over the insulating film 38 with use of a conductive film.

The electrode 25 may be used for the first bit line 7, or the first bit line may be formed over the insulating film 38 with use of a conductive film. Further, the electrode 33 may be used for the second bit line 11, or the second bit line 11 may be formed over the insulating film 38 with use of a conductive film.

(Embodiment 2)

This embodiment shows a memory device including a first memory cell and a second memory cell, and further includes a third transistor which is different from transistors included in the first memory cell and the second memory cell, and uses an oxide semiconductor film for a third channel. Specifically, the memory device includes a first memory cell having a first transistor and a first memory element, a second memory cell having a second transistor and a second memory element, and a third transistor. The first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second transistor includes a second channel, a second gate electrode, and a second source and drain electrodes; the second gate electrode is part of a second word line, or is electrically connected to the second word line; and one of the second source and drain electrodes is part of a second bit line or is electrically connected to the second bit line and the other is electrically connected to the second memory element. The third transistor includes a third channel, a third gate electrode, and a third source and drain electrodes; the third channel is formed of an oxide semiconductor film; and one of the third source and drain electrodes is electrically connected to the second word line and a selection signal to turn on the second transistor is input to the other of the third source and drain electrodes. A threshold voltage of the third transistor before ultraviolet ray irradiation is $V_{31}$; a threshold voltage of the third transistor at the time of ultraviolet ray irradiation is $V_{32}$;

and a threshold voltage of the third transistor after ultraviolet ray irradiation is $V_{33}$. Data is written to and read from the second memory element in the following manner: a voltage ($V_G$) is applied to the third gate electrode which is being irradiated with ultraviolet rays so that the third transistor is turned on, and a selection signal is input to the second gate electrode so that the second transistor is turned on. Note that $V_{32} \leq V_G < V_{33} < V_{31}$ (the voltage $V_G$ is equal to or higher than the voltage $V_{32}$) is satisfied.

Figure 4:
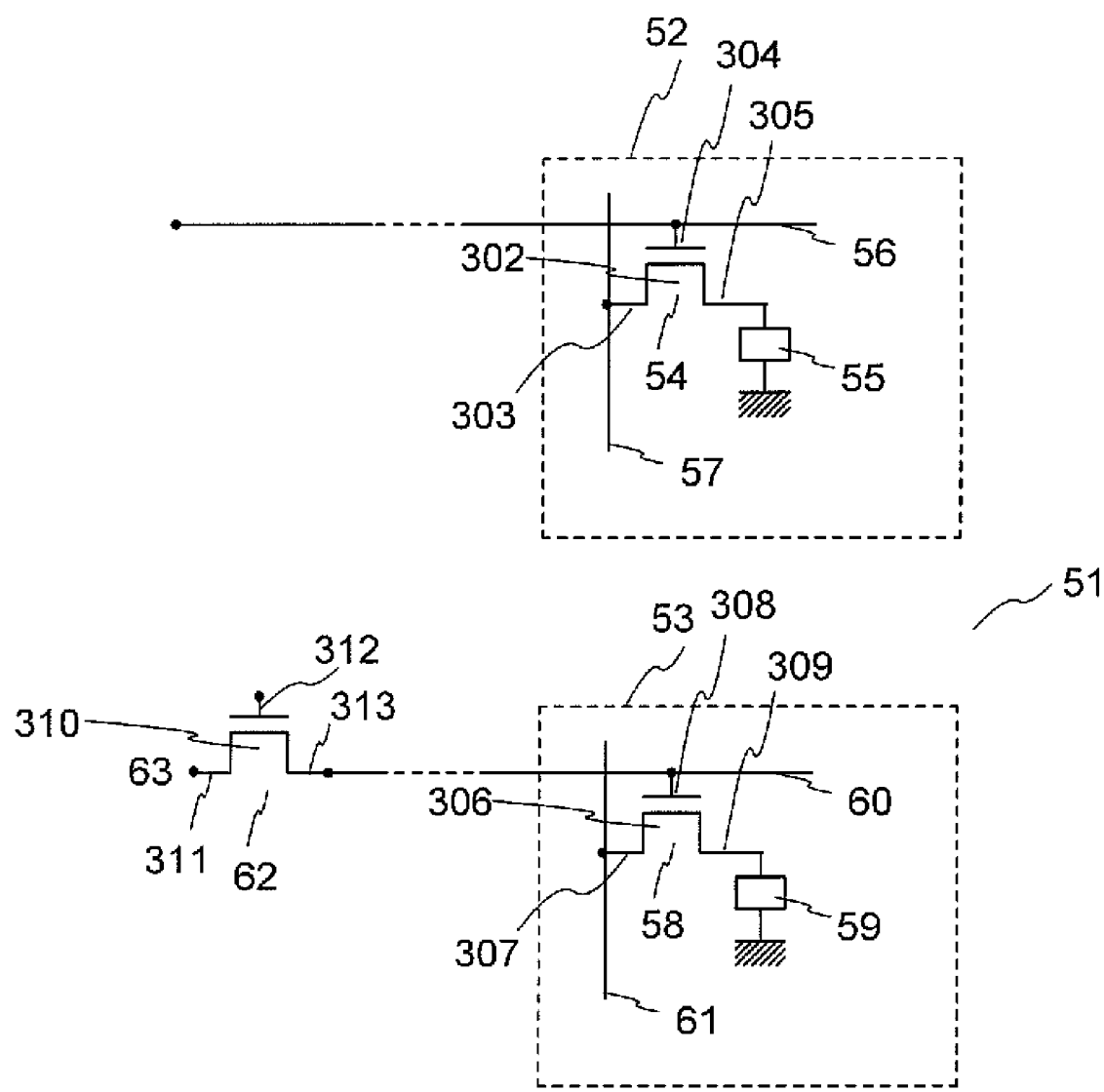
FIG. 4 is a diagram illustrating a memory device.

A memory device 51 includes a first memory cell 52, a second memory cell 53, and a third transistor 62 (FIG. 4).

The first memory cell 52 includes a first transistor 54 and a first memory element 55. A first gate electrode 304 of the first transistor 54 is electrically connected to a first word line 56, an electrode 303 (one of a first source and drain electrodes) is electrically connected to a first bit line 57, and an electrode 305 (the other of the first source and drain electrodes) is electrically connected to the first memory element 55. Note that the first gate electrode 304 may be part of the first word line 56, and the electrode 303 may be part of the first bit line 57.

The second memory cell 53 includes a second transistor 58 and a second memory element 59. A second gate electrode 308 of the second transistor 58 is electrically connected to a second word line 60, an electrode 307 (one of a second source and drain electrodes) is electrically connected to a second bit line 61, and an electrode 309 (the other of the second source and drain electrodes) is electrically connected to the second memory element 59. Note that the second gate electrode 308 may be part of the second word line 60, and the electrode 307 may be part of the second bit line 61.

A semiconductor film made of silicon is used for the first channel 302 of the first transistor 54 and the second channel 306 of the second transistor 58. Alternatively, a semiconductor film made of germanium, silicon-germanium, gallium arsenide, silicon carbide, or the like may be used. It is preferable that the same voltage ($V_W$) be applied to the first gate electrode 304 and the second gate electrode 308 to turn on the first transistor 54 and the second transistor 58. Note that the threshold voltage of the first transistor is $V_1$, the threshold voltage of the second transistor is $V_2$, and $V_1 < V_W$ and $V_2 < V_W$ are satisfied. Therefore, the first transistor 54 and the second transistor 58 preferably have the same structure.

A third channel 310 of the third transistor 62 is formed of an oxide semiconductor film. A signal to turn on or off the third transistor 62 is input to a third gate electrode 312 of the third transistor 62. An electrode 313 (one of a third source and drain electrodes) is electrically connected to the second word line 60. Here, the phrase "being electrically connected" includes the case of being electrically connected indirectly as well as the case of being electrically connected directly. Thus, the electrode 313 may be electrically connected directly to the second word line 60, or may be electrically connected to the second word line 60 through a level shifter and a buffer or through a decoder, a level shifter, and a buffer.

On the other hand, an electrode 311 (the other of the third source and drain electrodes) of the third transistor 62 is electrically connected to an input terminal 63 to which a selection signal to turn on or off the second transistor 58 is input.

Figure 5:
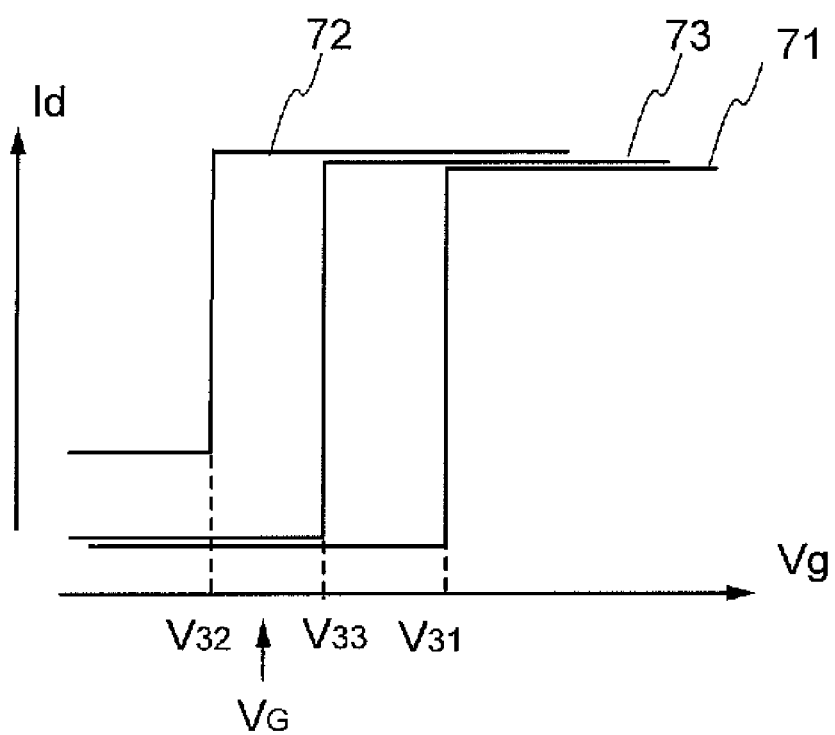
FIG. 5 is a graph showing a change in threshold voltage.

The threshold voltage of the third transistor 62 changes when the third channel is irradiated with ultraviolet (UV) rays (FIG. 5). FIG. 5 schematically shows the relationship between the gate voltage (Vg) and the drain current (Id) of the third transistor 62. A line 71, a line 72, and a line 73 represent the Vg-Id relationship of the third transistor 62 before UV ray irradiation, at the time of UV ray irradiation, and after UV ray irradiation, respectively. The threshold voltage of the third transistor 62 is $V_{31}$ without UV ray irradiation (before UV ray irradiation); $V_{32}$ at the time of UV ray irradiation; and $V_{33}$ after UV ray irradiation. The memory device 51 is controlled by utilizing this phenomenon.

When data writing and reading are practically performed, the voltage $V_G$ which satisfies $V_{32} \leq V_G < V_{33} < V_{31}$ (the voltage $V_G$ is equal to or higher than the voltage $V_{32}$) is applied to the third gate electrode 312 of the third transistor 62. As a result, the third transistor 62 can be turned on when being irradiated with UV rays, while the third transistor 62 is kept off when not being irradiated with UV rays. Note that the off-current of the third transistor 62 increases at the time of UV ray irradiation due to photo-leakage current.

Next, the operation of the memory device 51 will be described. Data that can be accessed by a third party is written to and read from the first memory element 55. Data that should not be accessed by a third party is written to and read from the second memory element 59.

1. Writing and Reading Data to and from the First Memory Element 55

Described first is operation in writing and reading data (charges) to and from the first memory element 55. A voltage $V_W$ is applied to the first word line 56 so that the voltage $V_W$ is applied to the first gate electrode 304 of the first transistor 54; thus, the first transistor 54 is turned on. When the first transistor 54 is turned on, data is written from the first bit line 57 to the first memory element 55. Data is stored in the first memory element 55 because a capacitor or the like is included in the first memory element 55. When data is read from the first memory element 55, a voltage $V_W$ is applied to the first word line 56 so that the voltage $V_W$ is applied to the first gate electrode 304 of the first transistor 54; thus, the first transistor 54 is turned on. When the first transistor 54 is turned on, data is read from the first memory element 55 to the first bit line 57.

On the other hand, a voltage $V_W$ to turn on the second transistor 58 is also applied to the input terminal 63, and a voltage $V_G$ is applied to the third gate electrode 312 of the third transistor 62. Note that the third transistor is not irradiated with UV rays. Since the voltage $V_G$ is lower than the threshold voltage ($V_{31}$) of the third transistor 62, the third transistor 62 is kept off. Therefore, the second transistor 58 is kept off and data cannot be written to and read from the second memory element 59.

1. Writing and Reading Data to and from the Second Memory Element 59

Described is operation in writing and reading data (charges) to and from the second memory element 59. A voltage $V_G$ is applied to the third gate electrode 312 of the third transistor 62. At this time, the third transistor 62, specifically, the third channel 310 is irradiated with UV rays. The threshold voltage of the third transistor 62 changes from $V_{31}$ to $V_{32}$. Since the voltage $V_G$ is higher than the threshold voltage ($V_{32}$) of the third transistor 62 which is irradiated with UV rays, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is written to the second memory element 59 from the second bit line 61. Data is stored in the second memory element 59 because a capacitor or the like is included in the second memory element 59.

Next, when data is read from the second memory element 59, a voltage $V_G$ is applied to the third gate electrode 312 of the third transistor 62. At this time, the third transistor 62 is irradiated with UV rays. The threshold voltage of the third transistor 62 changes to $V_{32}$. Since the voltage $V_o$ is higher than the threshold voltage ($V_{32}$) of the third transistor 62 which is irradiated with UV rays, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is read from the second memory element 59 to the second bit line 61.

After the data is written to and read from the second memory element 59, UV ray irradiation to the third transistor 62 is stopped. The threshold voltage of the third transistor 62 changes to $V_{33}$.

3. Writing and Reading Data to and from the First Memory Element 55 after the Threshold Voltage of the Third Transistor 62 Changes to $V_{33}$ Described is operation in writing and reading data to and from the first memory element 55 after the threshold voltage of the third transistor 62 changes to $V_{33}$. A voltage $V_W$ is applied to the first word line 56 so that the voltage $V_W$ is applied to the first gate electrode 304 of the first transistor 54; thus, the first transistor 54 is turned on. When the first transistor 54 is turned on, data is written from the first bit line 57 to the first memory element 55. Data is stored in the first memory element 55 because a capacitor or the like is included in the first memory element 55. When data is read from the first memory element 55, a voltage $V_W$ is applied to the first word line 56 so that the voltage $V_W$ is applied to the first gate electrode 304 of the first transistor 54; thus, the first transistor 54 is turned on. When the first transistor 54 is turned on, data is read from the first memory element 55 to the first bit line 57.

On the other hand, a voltage $V_W$ to turn on the second transistor 58 is also applied to the input terminal 63, and a voltage $V_G$ is applied to the third gate electrode 312 of the third transistor 62. Note that the third transistor is not irradiated with UV rays. Since the voltage $V_G$ is lower than the threshold voltage ($V_{33}$) of the third transistor 62, the third transistor 62 is kept off. Therefore, the second transistor 58 is kept off and data cannot be written to and read from the second memory element 59.

4. Writing and Reading Data to and from the Second Memory Element 59 after the Threshold Voltage of the Third Transistor 62 Changes to $V_{33}$ A voltage $V_G$ is applied to the third gate electrode 312 of the third transistor 62. At this time, the third transistor 62 is irradiated with UV rays. The threshold voltage of the third transistor 62 changes from $V_{33}$ to $V_{32}$. Since the voltage $V_G$ is higher than the threshold voltage ($V_{32}$) of the third transistor 62 which is irradiated with UV rays, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is written to the second memory element 59 from the second bit line 61. Data is stored in the second memory element 59 because a capacitor or the like is included in the second memory element 59.

Next, when data is read from the second memory element 59, a voltage $V_G$ is applied to the third gate electrode 312 of the third transistor 62. At this time, the third transistor 62 is irradiated with UV rays. Since the voltage $V_G$ is higher than the threshold voltage ($V_{32}$) of the third transistor 62 which is irradiated with UV rays, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is read from the second memory element 59 to the second bit line 61.

After the data is written to and read from the second memory element 59, UV ray irradiation to the third transistor 62 is stopped.

Figure 6:
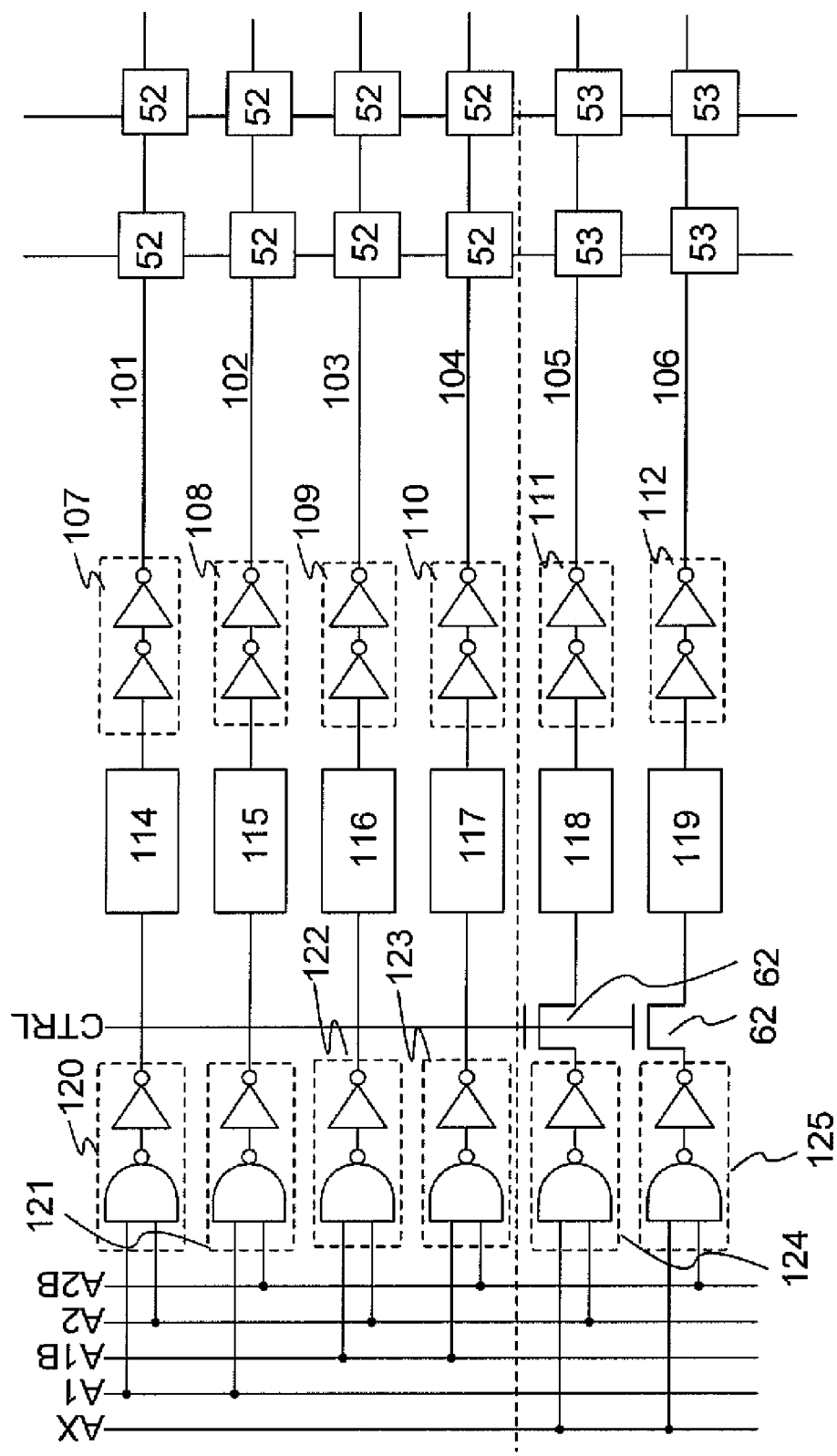
FIG. 6 is a diagram illustrating a memory device of Embodiment 2.

An example shown next is as follows: the third transistor 62 is provided between a decoder and a level shifter and is connected to a word line through the level shifter and a buffer (FIG. 6).

A plurality of the first memory cells 52 and a plurality of the second memory cells 53 are provided. Word lines 101 to 106, buffers 107 to 112, level shifters 114 to 119, and decoders 120 to 125 are provided.

The first memory cell 52 will be described taking as an example the decoder 120, the level shifter 114, the buffer 107, and the word line 101. The word line 101 is electrically connected to an output portion of the buffer 107, and an input portion of the buffer 107 is electrically connected to an output portion of the level shifter 114. An input portion of the level shifter 114 is electrically connected to an output portion of the decoder 120. A selection signal is input to input portions of the decoder 120 from an address line A1 and an address line A2.

The second memory cell 53 is electrically connected to the word line 105 or the word line 106. The decoder 124, the level shifter 118, and the word line 105 will be described as an example. The word line 105 is electrically connected to an output portion of the buffer 111, and an input portion of the buffer 111 is electrically connected to an output portion of the level shifter 118. An input portion of the level shifter 118 is electrically connected to the electrode 313 (one of the third source and drain electrodes) of the third transistor 62, and the electrode 311 (the other of the third source and drain electrodes) is electrically connected to an output portion of the decoder 124. A selection signal is input to input portions of the decoder 124 from an address line AX and the address line A2.

In accordance with the selection signal from the address line AX and the address line A2, the decoder 124 outputs a selection signal for writing and reading data to and from the second memory cell 53. The selection signal is input to the electrode 311 of the third transistor 62. A voltage $V_G$ is input to the third gate electrode 312 of the third transistor 62 from a control line CTRL. If the third transistor 62 is irradiated with UV rays at this time, the third transistor 62 is turned on and the selection signal is input to the word line 105 through the level shifter 118 and the buffer 111, whereby the second memory cell 53 is turned on. When the second memory cell 53 is turned on, data can be written to and read from the second memory cell 53.

The decoder 125, the third transistor 62, the level shifter 119, the buffer 112, the word line 106, and the second memory cell 53 also operate in the aforementioned manner. The second memory cell 53 cannot be accessed by a third party because the third transistor is provided.

Next, the first memory cell 52 will be described taking as an example the decoder 120, the level shifter 114, the buffer 107 and the word line 101. In accordance with a signal from the address line A1 and the address line A2, the decoder 120 outputs a selection signal for writing and reading data to and from the first memory cell 52. The selection signal is input to the word line 101 through the level shifter 114 and the buffer 107, whereby the first memory cell 52 is turned on. When the first memory cell 52 is turned on, data can be written to and read from the first memory cell 52. The first memory cell 52 can be accessed by a third party because the third transistor is not provided.

Figure 7:
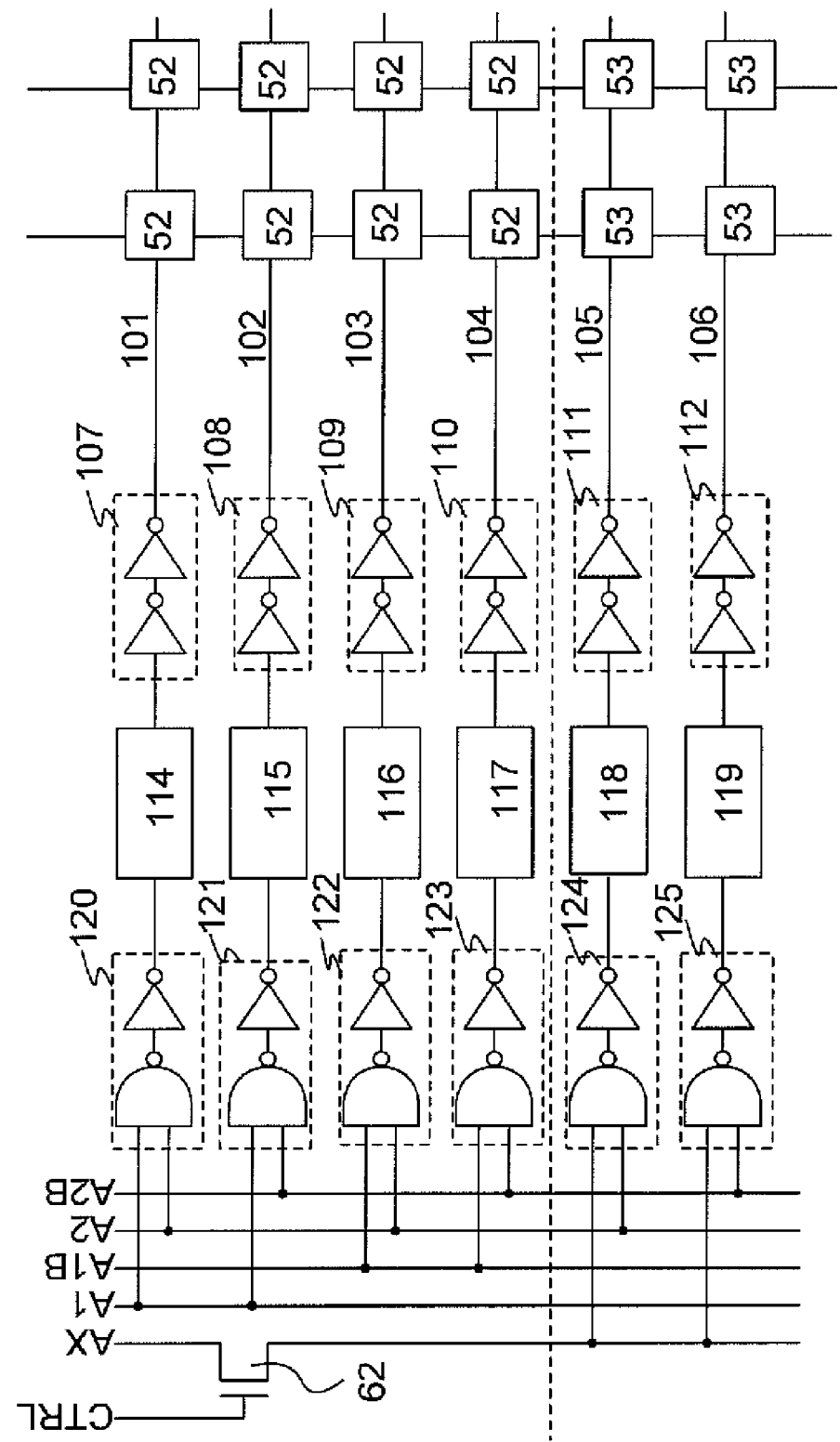
FIG. 7 is a diagram illustrating the memory device of Embodiment 2.

An example shown next is as follows: the electrode 313 (one of the third source and drain electrodes) of the third transistor 62 is connected to the input portion of the decoder (FIG. 7).

A plurality of the first memory cells 52 and a plurality of the second memory cells 53 are provided. The word lines 101 to 106, the buffers 107 to 112, the level shifters 114 to 119, and the decoders 120 to 125 are provided.

The first memory cell 52 will be described taking as an example the decoder 120, the level shifter 114, the buffer 107, and the word line 101. The word line 101 is electrically connected to the output portion of the buffer 107, and the input portion of the buffer 107 is electrically connected to the output portion of the level shifter 114. The input portion of the level shifter 114 is electrically connected to the output portion of the decoder 120. A selection signal is input to the input portion of the decoder 120 from the address line A1 and the address line A2.

The second memory cell 53 is electrically connected to the word line 105 or the word line 106. The decoder 124, the level shifter 118, and the word line 105 will be described as an example. The word line 105 is electrically connected to the output portion of the buffer 111, and the input portion of the buffer 111 is electrically connected to the output portion of the level shifter 118. The input portion of the level shifter 118 is electrically connected to the output portion of the decoder 124. One of the input portions of the decoder 124 is electrically connected to the electrode 313 of the third transistor 62, and the other is electrically connected to the address line A2. The electrode 311 of the third transistor 62 is electrically connected to the address line AX.

In accordance with a signal from the address line AX and the address line A2, the decoder 124 outputs a selection signal for writing and reading data to and from the second memory cell 53. The signal from the address line AX is first input to the electrode 311 of the third transistor 62. A voltage $V_G$ is input to the third gate electrode 312 of the third transistor 62 from the control line CTRL. If the third transistor 62 is irradiated with UV rays at this time, the third transistor 62 is turned on and the signal from the address line AX is input to the decoder 124. After that, the selection signal is input to the word line 105 through the level shifter 118 and the buffer 111, whereby the second memory cell 53 is turned on. When the second memory cell 53 is turned on, data can be written to and read from the second memory cell 53.

The decoder 125, the third transistor 62, the level shifter 119, the buffer 112, the word line 106, and the second memory cell 53 also operate in the aforementioned manner. The second memory cell 53 cannot be accessed by a third party because the third transistor is provided.

Next, the first memory cell 52 will be described taking as an example the decoder 120, the level shifter 114, the buffer 107 and the word line 101. In accordance with a signal from the address line A1 and the address line A2, the buffer 120 outputs a selection signal for writing and reading data to and from the first memory cell 52. The selection signal is input to the word line 101 through the level shifter 114 and the buffer 107, whereby the first memory cell 52 is turned on. When the first memory cell 52 is turned on, data can be written to and read from the first memory cell 52. The first memory cell 52 can be accessed by a third party because the third transistor 62 is not provided.

The structure and material of the first transistor 54 are similar to those of the first transistor 4 in Embodiment 1. The structure and material of the second transistor 58 are also similar to those of the first transistor 4 in Embodiment 1.

The structure and material of the first memory element 55 are similar to those of the first memory element 5 in Embodiment 1. The structure and material of the second memory element 59 are also similar to those of the first memory element 5 in Embodiment 1.

The structure and material of the third transistor 62 are similar to those of the second transistor 8 in Embodiment 1.

The memory device 51 can be manufactured using the method shown in Embodiment 1.

(Embodiment 3)

This embodiment is a modified example of Embodiment 2. A memory device including a fourth transistor in addition to the third transistor will be described. The third channel of the third transistor includes, like the first channel of the first transistor and the second channel of the second transistor, a semiconductor film such as a silicon film. A fourth channel of the fourth transistor is formed of an oxide semiconductor film. One of a fourth source and drain electrodes of the fourth transistor is electrically connected to the third gate electrode of the third transistor.

Specifically, a memory device includes a first memory cell having a first transistor and a first memory element, a second memory cell having a second transistor and a second memory element, a third transistor, and a fourth transistor. The first transistor includes a first channel, a first gate electrode, and a first source and drain electrodes; the first gate electrode is part of a first word line or is electrically connected to the first word line; and one of the first source and drain electrodes is part of a first bit line or is electrically connected to the first bit line and the other is electrically connected to the first memory element. The second transistor includes a second channel, a second gate electrode, and a second source and drain electrodes; the second gate electrode is part of a second word line or is electrically connected to the second word line; and one of the second source and drain electrodes is part of a second bit line or is electrically connected to the second bit line and the other is electrically connected to the second memory element. The third transistor includes a third channel, a third gate electrode, and a third source and drain electrodes; and one of the third source and drain electrodes is electrically connected to the second word line and a selection signal to turn on the second transistor is input to the other of the third source and drain electrodes. A fourth transistor includes a fourth channel, a fourth gate electrode, and a fourth source and drain electrodes; the fourth channel is formed of an oxide semiconductor film; and one of the fourth source and drain electrodes is electrically connected to the third gate electrode and a selection signal to turn on the third transistor is input to the other of the fourth source and drain electrodes. A threshold voltage of the fourth transistor before ultraviolet ray irradiation is $V_{31}$; a threshold voltage of the fourth transistor at the time of ultraviolet ray irradiation is $V_{32}$; and a threshold voltage of the fourth transistor after ultraviolet ray irradiation is $V_{33}$. Data is written to and read from the second memory element in the following manner: a voltage ($V_G$) is applied to the fourth gate electrode which is being irradiated with ultraviolet rays so that the fourth transistor is turned on and thus the third transistor is turned on, and a selection signal is input to the second gate electrode so that the second transistor is turned on. Note that $V_{32} \leq V_G < V_{33} < V_{31}$ (the voltage $V_G$ is equal to or higher than the voltage $V_{32}$) is satisfied.

Figure 16:
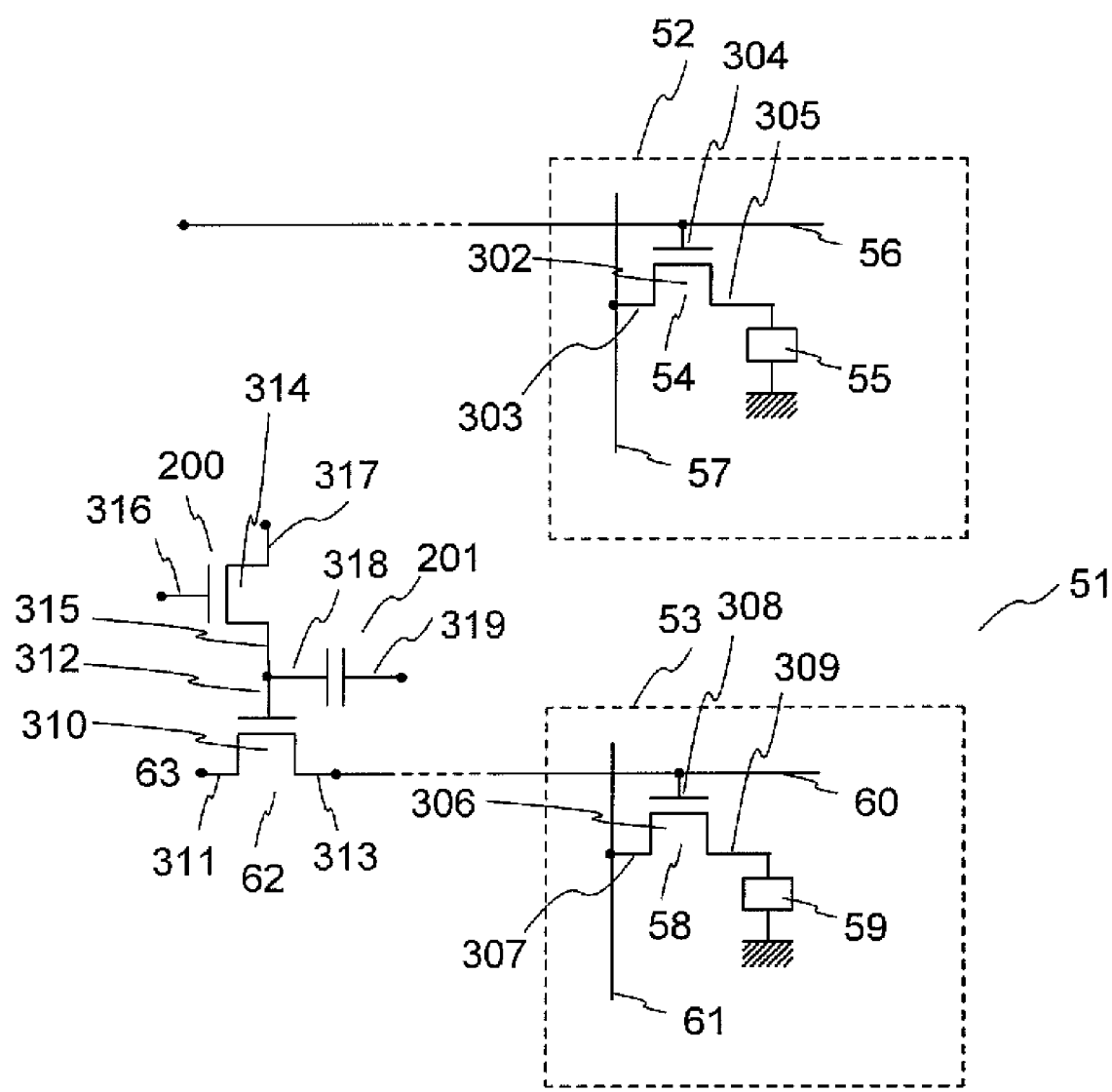
FIG. 16 is a diagram illustrating a memory device of Embodiment 3.

The memory device 51 includes the first memory cell 52, the second memory cell 53, the third transistor 62, and a fourth transistor 200 (FIG. 16).

The first memory cell 52 and the second memory cell 53 are the same as the first memory cell 52 and the second memory cell 53 in Embodiment 2.

A semiconductor film made of silicon or the like is used for the first channel 302 of the first transistor 54 and the second channel 306 of the second transistor 58. It is preferable that the same voltage ($V_W$) be applied to the first gate electrode 304 and the second gate electrode 308 to turn on the first transistor 54 and the second transistor 58. Note that the threshold voltage of the first transistor is $V_1$, the threshold voltage of the second transistor is $V_2$, and $V_1<V_W$ and $V_2<V_W$ are satisfied. Therefore, the first transistor 54 and the second transistor 58 preferably have the same structure.

The third channel 310 of the third transistor 62 is made of silicon like the first channel 302 of the first transistor 54 and the second channel 306 of the second transistor 58. Alternatively, the third channel 310 may be made of germanium, silicon-germanium, gallium arsenide, silicon carbide, or the like. A fourth channel 314 of the fourth transistor 200 is formed of an oxide semiconductor film.

It is preferable that the same voltage ($V_W$) be applied to the first gate electrode 304, the second gate electrode 308, and the third gate electrode 312 to turn on the first transistor 54, the second transistor 58, and the third transistor 62. Note that the threshold voltage of the first transistor 54 is $V_1$, the threshold voltage of the second transistor 58 is $V_2$, the threshold voltage of the third transistor 62 is $V_3$, and $V_1<V_W$, $V_2<V_W$, and $V_3<V_W$ are satisfied. Therefore, the first transistor 54, the second transistor 58, and the third transistor 62 preferably have the same structure.

A signal to turn on or off the third transistor 62 is input to the third gate electrode 312 of the third transistor 62. The electrode 313 (one of the third source and drain electrodes) is electrically connected to the second word line 60. Here, the phrase "being electrically connected" includes the case of being electrically connected indirectly as well as the case of being electrically connected directly. Thus, the electrode 313 may be electrically connected directly to the second word line 60, or may be electrically connected to the second word line 60 through a level shifter and a buffer or through a decoder, a level shifter, and a buffer.

On the other hand, the electrode 311 (the other of the third source and drain electrodes) of the third transistor 62 is electrically connected to the input terminal 63 to which a selection signal to turn on or off the second transistor 58 is input.

A signal to turn on or off the fourth transistor 200 is input to the fourth gate electrode 316 of the fourth transistor 200. An electrode 315 (one of a fourth source and drain electrodes) is electrically connected to the third gate electrode 312 of the third transistor 62. A selection signal to turn on or off the third transistor 62 is input to an electrode 317 (the other of the fourth source and drain electrodes). A capacitor 201 may be provided as needed. The capacitor 201 stores charges for turning on the third transistor even when the fourth transistor 200 is turned off. An electrode 318 of the capacitor 201 is electrically connected to the electrode 315 and the gate electrode 312 of the third transistor 62. A reference voltage is applied to another electrode 319.

The threshold voltage of the fourth transistor 200 changes when the fourth channel 314 is irradiated with ultraviolet (UV) rays (FIG. 5). The line 71, the line 72, and the line 73 represent the Vg-Id relationship of the fourth transistor 200 before UV ray irradiation, at the time of UV ray irradiation, and after UV ray irradiation, respectively. The threshold voltage of the fourth transistor 200 is $V_{31}$ without UV ray irradiation (before UV ray irradiation); $V_{32}$ at the time of UV ray irradiation; and $V_{33}$ after UV ray irradiation. The memory device 51 is controlled by utilizing this phenomenon.

When data writing and reading are practically performed, the voltage $V_G$ which satisfies $V_{32} \leq V_{33} < V_{31}$ (the voltage $V_G$ is equal to or higher than the voltage $V_{32}$) is applied to the fourth gate electrode of the fourth transistor 200. As a result, the fourth transistor 200 can be turned on when being irradiated with UV rays, while the fourth transistor 200 is kept off when not being irradiated with UV rays. In the case where the fourth transistor before UV ray irradiation and after UV ray irradiation is a normally-off transistor, $V_G$ may be equal to 0 V.

When the fourth channel 314 is irradiated with UV rays so that the fourth transistor 200 is turned on, a selection signal to turn on or off the third transistor 62 is input from the electrode 317 to the third gate electrode 312.

Next, the operation of the memory device 51 will be described. Data that can be accessed by a third party is written to and read from the first memory element 55. Data that should not be accessed by a third party is written to and read from the second memory element 59.

1. Writing and Reading Data to and from the First Memory Element 55

Described first is operation in writing and reading data (charges) to and from the first memory element 55. A voltage $V_W$ is applied to the first word line 56 so that the voltage $V_W$ is applied to the first gate electrode 304 of the first transistor 54; thus, the first transistor 54 is turned on. When the first transistor 54 is turned on, data is written from the first bit line 57 to the first memory element 55. Data is stored in the first memory element 55 because a capacitor or the like is included in the first memory element 55. When data is read from the first memory element 55, a voltage $V_W$ is applied to the first word line 56 so that the voltage $V_W$ is applied to the first gate electrode 304 of the first transistor 54; thus, the first transistor 54 is turned on. When the first transistor 54 is turned on, data is read from the first memory element 55 to the first bit line 57.

On the other hand, a voltage $V_W$ to turn on the second transistor 58 is also applied to the input terminal 63, and a voltage $V_G$ is applied to the fourth gate electrode 316 of the fourth transistor 200. Note that the fourth transistor is not irradiated with UV rays. Since the voltage $V_G$ is lower than the threshold voltage ($V_{31}$) of the fourth transistor 200, the fourth transistor 200 is kept off. Therefore, the third transistor 62 and the second transistor 58 are kept off and data cannot be written to and read from the second memory element 9.

1. Writing and Reading Data to and from the Second Memory Element 59

Described is operation in writing and reading data (charges) to and from the second memory element 59. A voltage $V_G$ is applied to the fourth gate electrode 316 of the fourth transistor 200. At this time, the fourth channel 314 is irradiated with UV rays. The threshold voltage of the fourth transistor 200 changes from $V_{31}$ to $V_{32}$. Since the voltage $V_G$ is higher than the threshold voltage ($V_{32}$) of the fourth transistor 200 which is irradiated with UV rays, the fourth transistor 200 is turned on. When the fourth transistor 200 is turned on, a selection signal (voltage $V_W$) to turn on the third transistor 62 is input from the electrode 317 to the third gate electrode 312. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is written to the second memory element 59 from the second bit line 61. Data is stored in the second memory element 59 because a capacitor or the like is included in the second memory element 59.

Next, when data is read from the second memory element 59, a voltage $V_G$ is applied to the fourth gate electrode 316 of the fourth transistor 200. At this time, the fourth transistor 200 is irradiated with UV rays to be turned on. When the fourth transistor 200 is turned on, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is read from the second memory element 59 to the second bit line 61.

After the data is written to and read from the second memory element 59, UV ray irradiation to the fourth transistor 200 is stopped. The threshold voltage of the fourth transistor 200 changes to $V_{33}$, and the fourth transistor 200 is turned off. Since the fourth channel 314 is formed of an oxide semiconductor, the fourth transistor has a low off-current. Accordingly, the potential of the third gate electrode 312 of the third transistor 62 can be kept. In addition, if the capacitor 201 is provided, charges held in the capacitor 201 make it possible to keep the potential of the third gate electrode 312. Since the potential of the third gate electrode 312 is kept, the third transistor 62 can be turned on even when not being irradiated with UV rays.

3. Writing and Reading Data to and from the First Memory Element 55 after the Threshold Voltage of the Fourth Transistor 200 Changes to $V_{33}$ Described is operation in writing and reading data to and from the first memory element 55 after the threshold voltage of the fourth transistor 200 changes to $V_{33}$. A voltage $V_W$ is applied to the first word line 56 so that the voltage $V_W$ is applied to the first gate electrode 304 of the first transistor 54; thus, the first transistor 54 is turned on. When the first transistor 54 is turned on, data is written from the first bit line 57 to the first memory element 55. Data is stored in the first memory element 55 because a capacitor or the like is included in the first memory element 55. When data is read from the first memory element 55, a voltage $V_W$ is applied to the first word line 56 so that the voltage $V_W$ is applied to the first gate electrode 304 of the first transistor 54; thus, the first transistor 54 is turned on. When the first transistor 54 is turned on, data is read from the first memory element 55 to the first bit line 57.

On the other hand, a voltage $V_W$ to turn on the second transistor 58 is applied to the input terminal 63, and a voltage $V_G$ is applied to the fourth gate electrode 316 of the fourth transistor 200. Note that the fourth transistor 200 is not irradiated with UV rays. Since the voltage $V_G$ is lower than the threshold voltage ($V_{33}$) of the fourth transistor 200, the fourth transistor 200 is kept off. Therefore, the third transistor 62 and the second transistor 58 are kept off and data cannot be written to and read from the second memory element 9.

4. Writing and Reading Data to and from the Second Memory Element 59 after the Threshold Voltage of the Fourth Transistor 200 Changes to $V_{33}$ A voltage $V_G$ is applied to the fourth gate electrode 316 of the fourth transistor 200. At this time, the fourth transistor 200 is irradiated with UV rays. Since the voltage $V_G$ is higher than the threshold voltage ($V_{32}$) of the fourth transistor 200 which is irradiated with UV rays, the fourth transistor 200 is turned on. When the fourth transistor 200 is turned on, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is written to the second memory element 59 from the second bit line 61. Data is stored in the second memory element 59 because a capacitor or the like is included in the second memory element 59.

Next, when data is read from the second memory element 59, a voltage $V_G$ is applied to the fourth gate electrode 316 of the fourth transistor 200. At this time, the fourth transistor 200 is irradiated with UV rays to be turned on. When the fourth transistor 200 is turned on, the third transistor 62 is turned on. When the third transistor 62 is turned on, the voltage $V_W$ applied to the input terminal 63 is applied to the second word line 60 and then to the second gate electrode 308 of the second transistor 58, whereby the second transistor 58 is turned on. When the second transistor 58 is turned on, data is read from the second memory element 59 to the second bit line 61.

After the data is written to and read from the second memory element 59, UV ray irradiation to the fourth transistor 200 is stopped. Note that since the fourth transistor 200 has a low off-current, the potential of the third gate electrode 312 of the third transistor 62 can be kept. In addition, if the capacitor 201 is provided, charges held in the capacitor 201 make it possible to keep the potential of the third gate electrode 312.

The structure and material of the first transistor 54 are similar to those of the first transistor 4 in Embodiment 1. The structure and material of the second transistor 55 and the third transistor 62 are also similar to those of the first transistor 4 in Embodiment 1.

The structure and material of the first memory element 55 are similar to those of the first memory element 5 in Embodiment 1. The structure and material of the second memory element 59 are also similar to those of the first memory element 5 in Embodiment 1.

The structure and material of the fourth transistor 200 are similar to those of the second transistor 8 in Embodiment 1.

The memory device 51 can be manufactured using the method shown in Embodiment 1.

(Embodiment 4)

This embodiment shows another example of the structure of Embodiment 1, in which data cannot be written to the second memory element 9 by a third party. Specifically, the memory device includes a writing circuit, an analog switch, and a third transistor. The third transistor includes a third channel, a third gate electrode, and a third source and drain electrodes, and the third channel is formed of an oxide semiconductor film. An output of the writing circuit is input to the analog switch; an output of the analog switch is input to one of the source and drain electrodes of the second transistor; a writing enable signal is input to one of the third source and drain electrodes; the other of the third source and drain electrodes is connected to a first control terminal of the analog switch; and an inverted signal of the writing enable signal is input to a second control terminal of the analog switch. A threshold voltage of the third transistor before ultraviolet ray irradiation is $V_{31}$; a threshold voltage of the third transistor at the time of ultraviolet ray irradiation is $V_{32}$; and a threshold voltage of the third transistor after ultraviolet ray irradiation is $V_{33}$. Data is written to the second memory element in the following manner: a voltage ($V_A$) is applied to the third gate electrode which is being irradiated with ultraviolet rays so that the third transistor is turned on, the writing enable signal is input to the first control terminal, the output of the writing circuit is input to one of the second source and drain electrodes, and a voltage ($V_W$) is applied to the second gate electrode so that the second transistor is turned on. Note that $V_{32} \leq V_A < V_{33} < V_{31}$ (the voltage $V_A$ is equal to or higher than the voltage $V_{32}$), and $V_{23} < V_{21} < V_W$ are satisfied.

Figure 8:
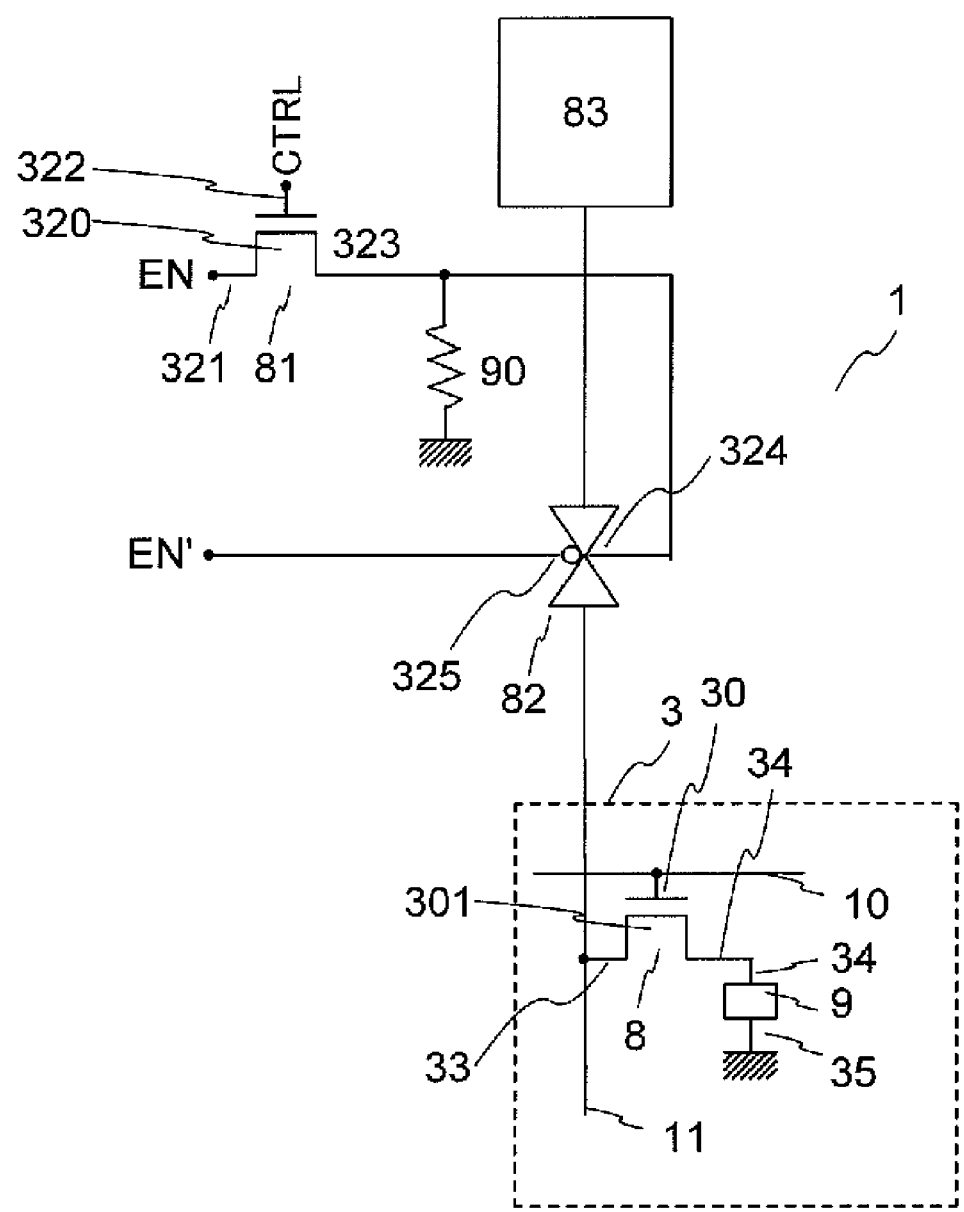
FIG. 8 is a diagram illustrating a memory device of Embodiment 4.

The memory device 1 shown in this embodiment includes a writing circuit 83, an analog switch 82, and a third transistor 81 in addition to the structure illustrated in FIG. 1 (FIG. 8). The third transistor 81 includes a third channel 320, a third gate electrode 322, an electrode 321 (one of a third source and drain electrodes), and an electrode 323 (the other of the third source and drain electrodes). The third channel 320 of the third transistor 81 is formed of an oxide semiconductor film.

An output of the writing circuit 83 is input to the analog switch 82. The writing circuit 83 is a circuit for outputting a writing voltage, and a known circuit may be used for the writing circuit 83. An output of the analog switch 82 is input to the electrode 33 of the second transistor 8. A writing (EN) enable signal is input to the electrode 321 of the third transistor 81, and the other electrode 323 is connected to a first control terminal 324 of the analog switch 82. An inverted signal of the writing enable signal (EN') is input to a second control terminal 325 of the analog switch 82.

Figure 9:
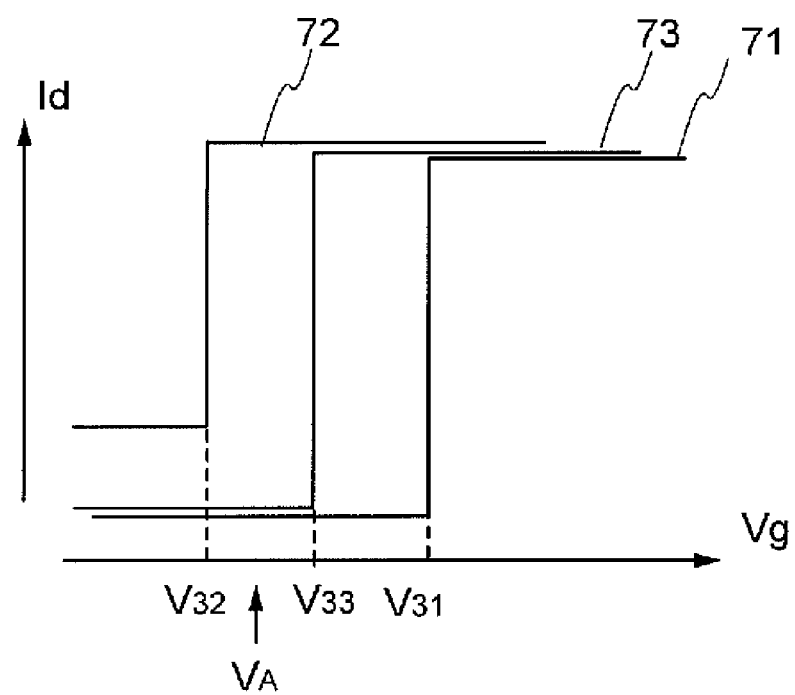
FIG. 9 is a graph showing a change in threshold voltage.

The threshold voltage of the third transistor 81 changes when the third channel 320 is irradiated with ultraviolet (UV) rays (FIG. 9). FIG. 9 schematically shows the relationship between the gate voltage (Vg) and the drain current (Id) of the third transistor 81. The line 71, the line 72, and the line 73 represent the Vg-Id relationship of the third transistor 81 before UV ray irradiation, at the time of UV ray irradiation, and after UV ray irradiation, respectively. The threshold voltage of the third transistor 81 is $V_{31}$ without UV ray irradiation (before UV ray irradiation); $V_{32}$ at the time of UV ray irradiation; and $V_{33}$ after UV ray irradiation. Data writing is performed by utilizing this phenomenon.

When data writing is practically performed, a voltage $V_A$ which satisfies $V_{32} \leq V_A < V_{33} < V_{31}$ (the voltage $V_A$ is equal to or higher than the voltage $V_{32}$) is applied to the third gate electrode 322 of the third transistor 81. As a result, the third transistor 81 can be turned on when being irradiated with UV rays, while the third transistor 81 is kept off when not being irradiated with UV rays. Note that the off-current of the third transistor 81 increases at the time of UV ray irradiation due to photo-leakage current.

Data which is to be stored in the second memory element 9 is output from the writing circuit 83 and then input to the analog switch 92. A writing enable signal (EN) is input to the first control terminal 324 of the analog switch 82, and an inverted signal of the writing enable signal (EN') is input to the second control terminal 325 of the analog switch 82. The writing enable signal is first input to the electrode 321 of the third transistor 81. A voltage $V_A$ is input to the third gate electrode 322 of the third transistor 81 from the control line CTRL. If the third transistor 81 is irradiated with UV rays at this time, the third transistor 81 is turned on and the writing enable signal is input to the first control terminal 324 of the analog switch 82. Then, the analog switch 82 is turned on and the data is input from the writing circuit 83 to the electrode 33 of the second transistor 8 through the second bit line 11. At this time, a voltage $V_W$ ($V_{23} < V_{21} < V_W$) is input from the second word line 10 to the second gate electrode 30 of the second transistor 8 so that the second transistor 8 is turned on; then, the data is stored in the second memory element 9. When the third transistor 81 is provided in this manner, data cannot be written to the second memory element 9 by a third party.

Although a reading circuit is not illustrated in FIG. 8, it is needless to say that the memory device 1 includes a reading circuit. The analog switch 82 includes two control terminals: the first control terminal 324 and the second control terminal 325. In order to prevent an unstable state such that one control terminal is turned on and the other is turned off, a pull-down resistor 90 may be provided as illustrated in FIG. 8.

The structure and material of the third transistor 81 are similar to those of the second transistor 8 in Embodiment 1.

The memory device 1 can be manufactured using the method shown in Embodiment 1.

(Embodiment 5)

Figure 10:
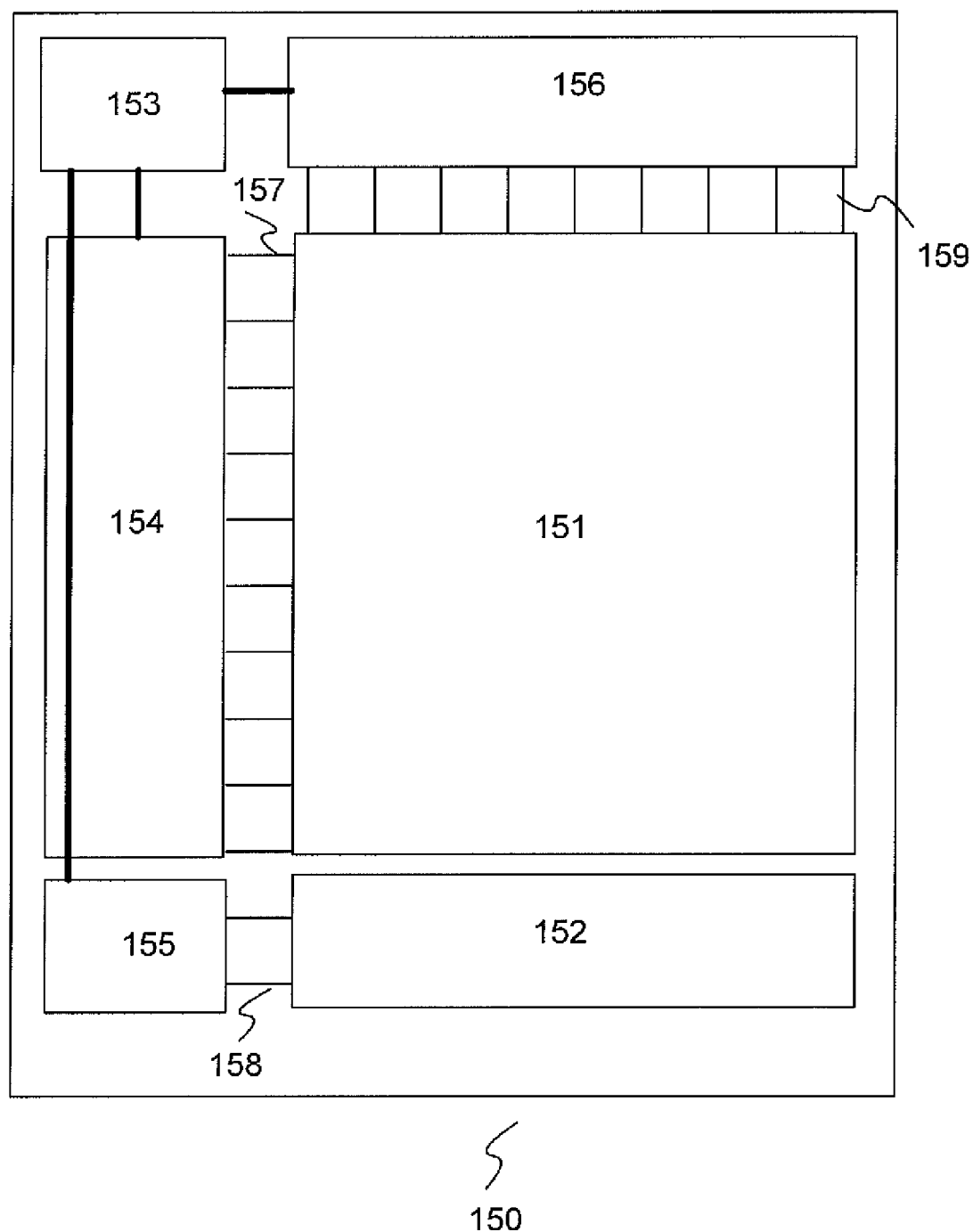
FIG. 10 is a diagram illustrating a memory module.

Shown in this embodiment is a memory module 150 to which any of Embodiments 1 to 4 is applied (FIG. 10). The memory module 150 includes a first memory cell region 151, a second memory cell region 152, an interface 153, a row decoder 154, a row decoder 155, and a column decoder 156.

Figure 15:
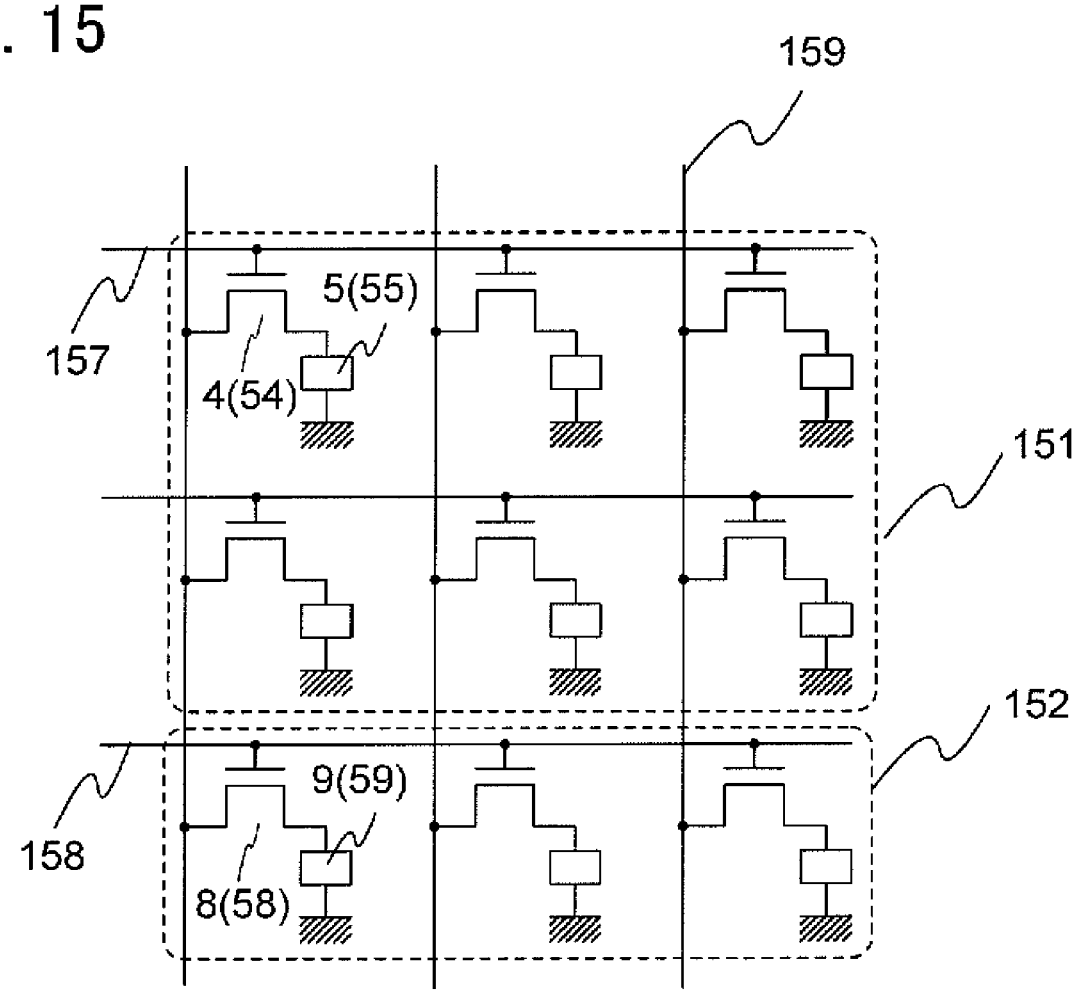
FIG. 15 is a diagram illustrating a memory module.

The first memory cell region 151 includes a plurality of first memory cells 2 (52) shown in the above embodiments. The second memory cell region 152 includes a plurality of second memory cells 3 (53) shown in the above embodiments (FIG. 15).

The row decoder 154 includes, for example, the decoders 120 to 123, the level shifters 114 to 117, and the buffers 107 to 110 that are shown in the above embodiments, and is connected to the first memory region 151 through word lines 157. The row decoder 155 includes, for example, the decoders 124 and 125, the level shifters 118 and 119, and the buffers 111 and 112 that are shown in the above embodiments, and is connected to the second memory cell region 152 through word lines 158.

The column decoder 156 includes, for example, the writing circuit 83 and the reading circuit that are shown in the above embodiments, and is connected to the first memory cell region 151 and the second memory cell region 152 through bit lines 159.

The row decoder 154, the row decoder 155, and the column decoder 156 each are connected to the interface 153.

As described in the above embodiments, a transistor using an oxide semiconductor film for a channel is provided in any of the second memory cell region 152, the row decoder 155, and the column decoder 156. In the present invention, the threshold voltage of a transistor is changed by irradiating the transistor with ultraviolet (UV) rays. Therefore, it is preferable that the region is generally covered with a shield which blocks UV rays. The shield is removed by a person admitted to the region, and then the transistor is irradiated with UV rays. Since the region is covered with the shield, the region cannot be accessed by a third party.

(Embodiment 6)

Figure 11:
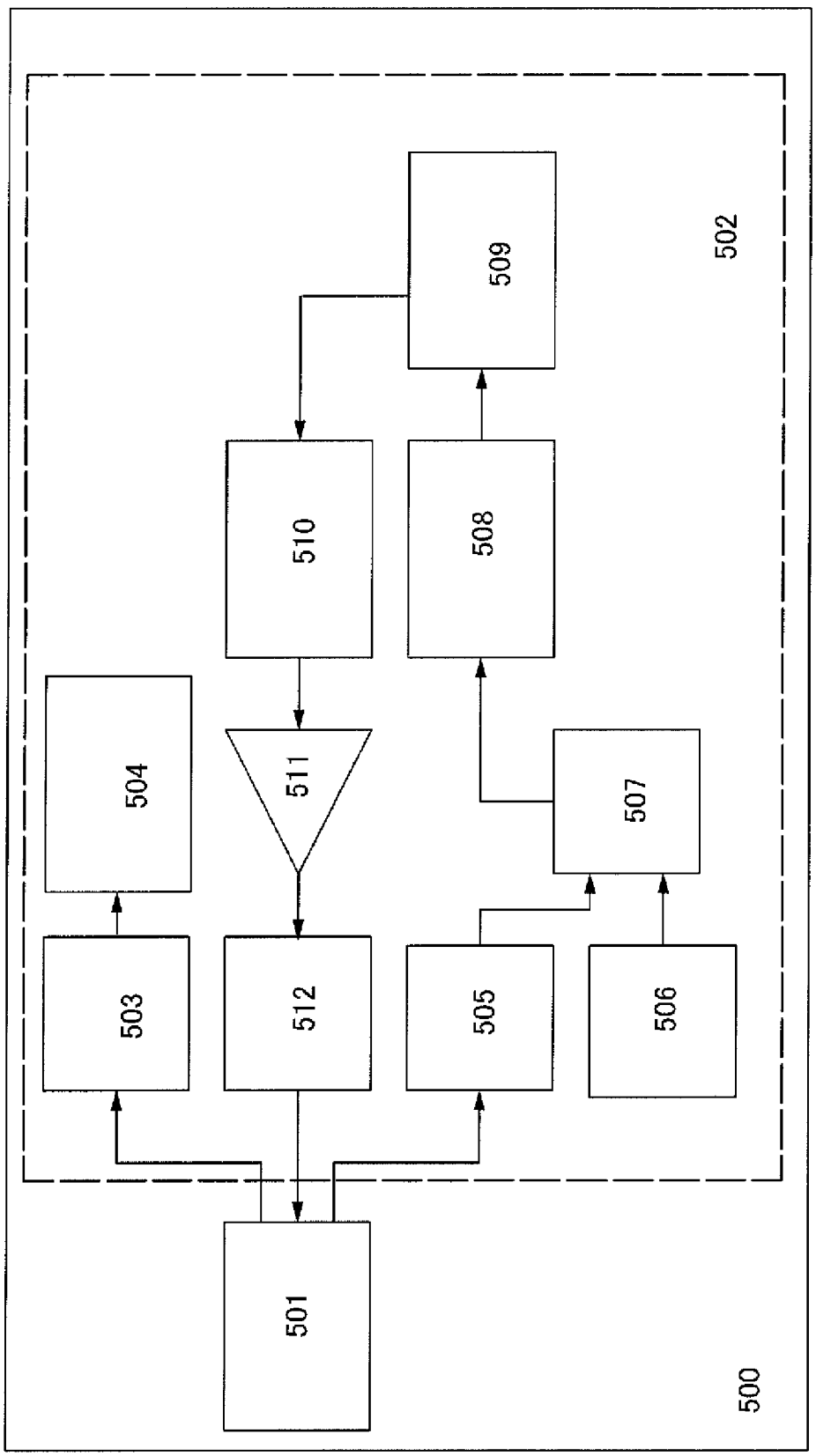
FIG. 11 is a diagram illustrating an RFID tag.

Shown in this embodiment is an RFID tag 500 including the memory module described in the above embodiment (FIG. 11).

The RFID tag 500 includes an antenna circuit 501 and a signal processing circuit 502. The signal processing circuit 502 includes a rectifier circuit 503, a power supply circuit 504, a demodulation circuit 505, an oscillation circuit 506, a logic circuit 507, a memory control circuit 508, a memory circuit 509, a logic circuit 510, an amplifier 511, and a modulation circuit 512. The memory circuit 509 includes the memory module described in the above embodiment.

A communication signal received by the antenna circuit 501 is input to the demodulation circuit 505. The frequency of the communication signal received, that is, the frequency of a signal communicated between the antenna circuit 501 and a reader/writer is, for example, 13.56 MHz, 915 MHz, or 2.45 GHz in UHF (ultra high frequency) band, which is determined on the basis of the ISO standards or the like. Needless to say, the frequency of a signal communicated between the antenna circuit 501 and a reader/writer is not limited to this, and it is possible to use, for example, 300 GHz to 3 THz which is a submillimeter wave, 30 GHz to 300 GHz which is a millimeter wave, 3 GHz to 30 GHz which is a microwave, 300 MHz to 3 GHz which is an ultra high frequency, and 30 MHz to 300 MHz which is a very high frequency. Further, a signal communicated between the antenna circuit 501 and a reader/writer is a carrier modulated signal. A carrier wave is modulated by analog modulation or digital modulation, and any of amplitude modulation, phase modulation, frequency modulation, and spread spectrum may be used. Preferably, amplitude modulation or frequency modulation is used.

An oscillation signal output from the oscillation circuit 506 is supplied as a clock signal to the logic circuit 507. In addition, the modulated carrier wave is demodulated in the demodulation circuit 505. The demodulated signal is transmitted to the logic circuit 507 and analyzed. The signal analyzed in the logic circuit 507 is transmitted to the memory control circuit 508. The memory control circuit 508 controls the memory circuit 509 so that data is taken from the memory circuit 509 and transmitted to the logic circuit 510. The signal transmitted to the logic circuit 510 is encoded in the logic circuit 510 and amplified in the amplifier 511. With the amplified signal, the modulation circuit 512 modulates a carrier wave. In accordance with the modulated carrier wave, the reader/writer recognizes the signal from the RFID tag 500.

A carrier wave input to the rectifier circuit 503 is rectified and then input to the power supply circuit 504. A power supply voltage obtained in this manner is supplied from the power supply circuit 504 to the demodulation circuit 505, the oscillation circuit 506, the logic circuit 507, the memory control circuit 508, the memory circuit 509, the logic circuit 510, the amplifier 511, the modulation circuit 512, and the like.

There is no particular limitation on the connection between the signal processing circuit 502 and an antenna in the antenna circuit 501. For example, the antenna and the signal processing circuit 502 are connected by wire bonding or bump connection. Alternatively, the signal processing circuit 502 is formed to have a chip shape and one surface thereof is used as an electrode and attached to the antenna. The signal processing circuit 502 and the antenna can be attached to each other with use of an ACF (anisotropic conductive film).

The antenna is stacked over the same substrate as the signal processing circuit 502, or formed as an external antenna. Needless to say, the antenna is provided above or below the signal processing circuit.

In the rectifier circuit 503, an AC signal that is induced by a carrier wave received by the antenna circuit 501 is converted into a DC signal.

Figure 12:
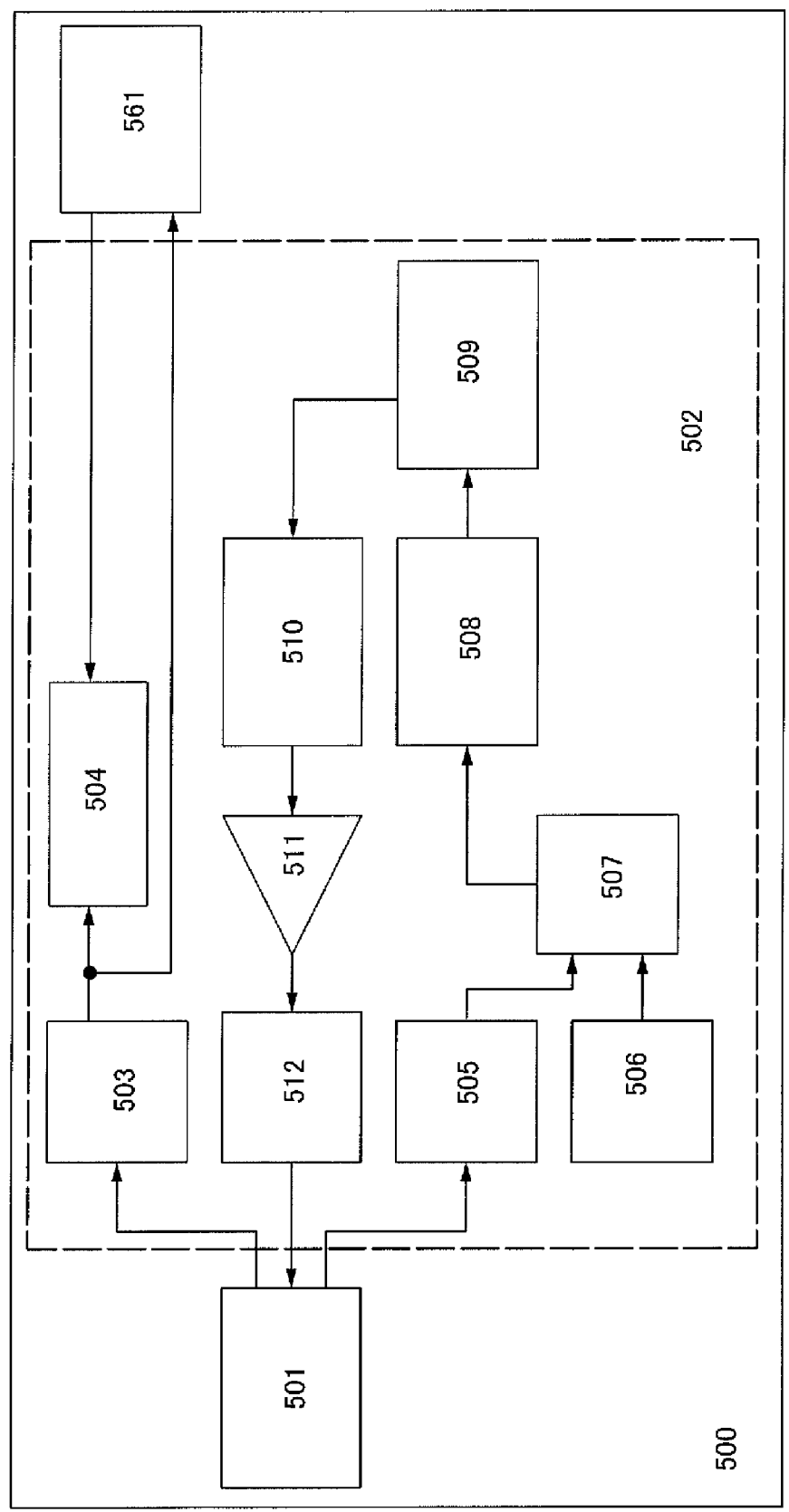
FIG. 12 is a diagram illustrating an RFID tag.

The RFID tag 500 may include a battery 561 (FIG. 12). When a power supply voltage output from the rectifier circuit 503 is not high enough to operate the signal processing circuit 502, the battery 561 also supplies power supply voltage to each circuit of the signal processing circuit 502, such as the demodulation circuit 505, the oscillation circuit 506, the logic circuit 507, the memory control circuit 508, the memory circuit 509, the logic circuit 510, the amplifier 511, and the modulation circuit 512.

Surplus voltage of the power supply voltage output from the rectifier circuit 503 may be stored in the battery 561. When an antenna circuit and a rectifier circuit are provided in the RFID tag 500 in addition to the antenna circuit 501 and the rectifier circuit 503, energy stored in the battery 561 can be obtained from electromagnetic waves and the like that are generated randomly.

A battery can be continuously used by charging. As the battery, a battery formed into a sheet form is used. For example, by using a lithium polymer battery that includes a gel electrolyte, a lithium ion battery, a lithium secondary battery, or the like, a reduction in the size of the battery is realized. For example, a nickel metal hydride battery or a nickel cadmium battery can be used. Alternatively, a capacitor having high capacitance, or the like can be used.

(Embodiment 7)

In this embodiment, application examples of an RFID tag 800 shown in the above embodiment will be shown (FIGS. 13A to 13F).

Figure 13A:
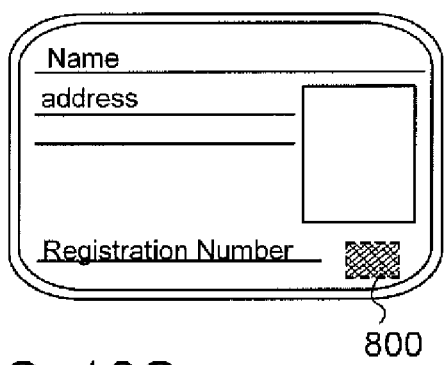
FIGS. 13A to 13F are views illustrating application examples of an RFID tag.
Figure 13B:
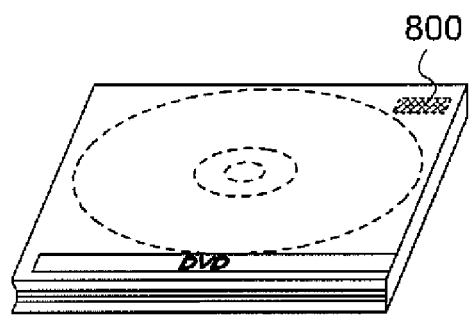
Figure 13C:
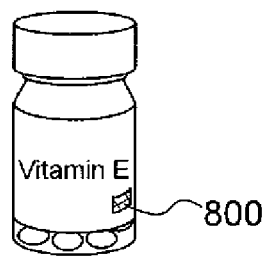
Figure 13D:
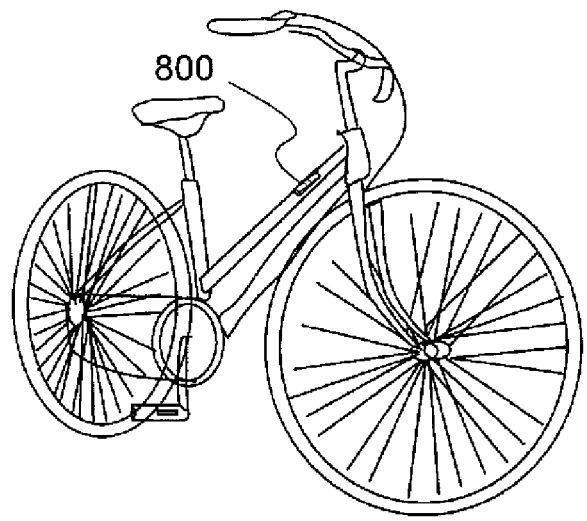
Figure 13E:
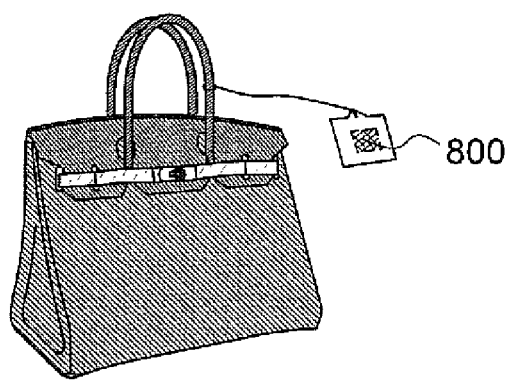
Figure 13F:
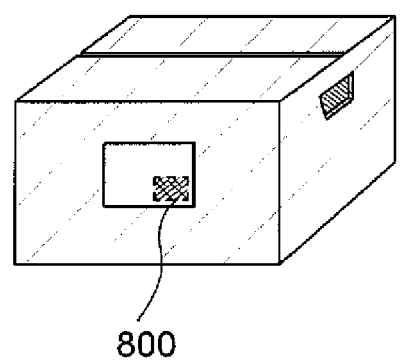

The RF tag 800 is widely used and can be provided for, for example, products such as bills, coins, securities, bearer bonds, documents (e.g., driver's licenses or resident's cards, see FIG. 13A), packaging containers (e.g., wrapping paper or bottles, see FIG. 13C), recording media (e.g., DVD software or video tapes, see FIG. 13B), vehicles (e.g., bicycles, see FIG. 13D), personal belongings (e.g., bags or glasses), foods, plants, animals, human bodies, clothing, household goods, and electronic appliances (e.g., liquid crystal display devices, EL display devices, television sets, or cellular phones), or tags on products (see FIGS. 13E and 13F).

The RF tag 800 is fixed to a product by being mounted on a printed board, attached to a surface of the product, or embedded in the product. For example, the RF tag 800 is fixed to each product by being embedded in paper of a book, or embedded in an organic resin of a package. Since the RF tag 800 can be reduced in size, thickness, and weight, it can be fixed to a product without spoiling the design of the product. Further, bills, coins, securities, bearer bonds, documents, or the like can have an identification function by being provided with the RF tag 800, and the identification function can be utilized to prevent counterfeiting. Moreover, the efficiency of a system such as an inspection system can be improved by providing the RF tag for packaging containers, recording media, personal belongings, foods, clothing, household goods, electronic appliances, or the like. Vehicles can also have higher security against theft or the like by being provided with the RF tag 800.

Example 1

Figure 14A:
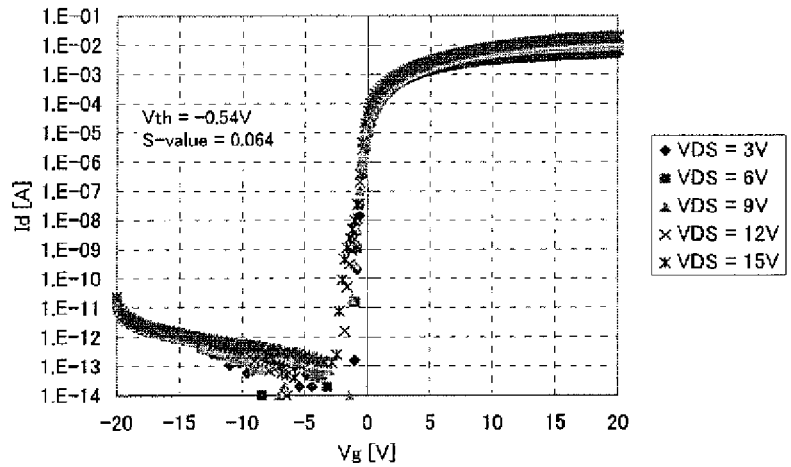
FIGS. 14A to 14C are graphs each showing a change in threshold voltage.
Figure 14B:
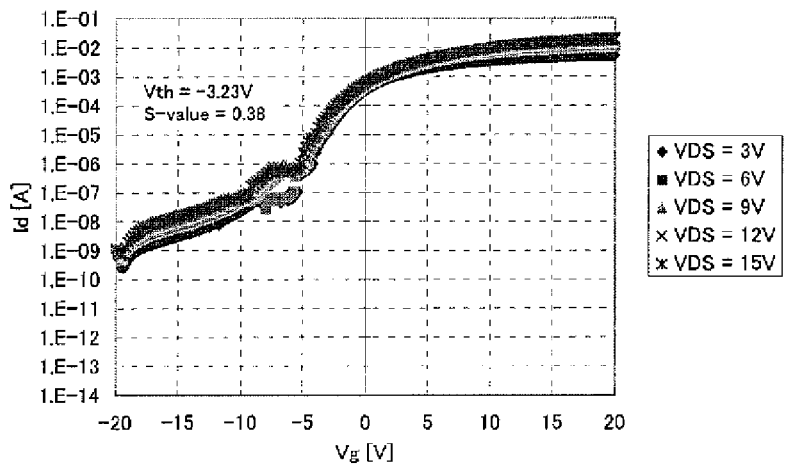
Figure 14C:
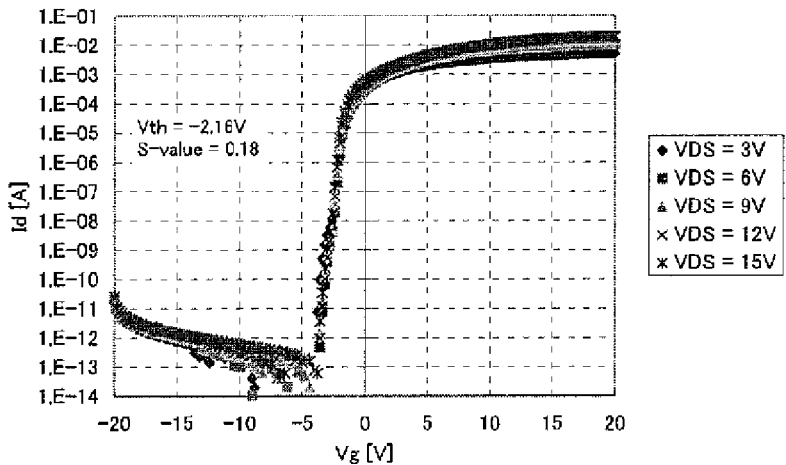

FIGS. 14A to 14C each show an example of measurement of the relationship between Vg (V) and Id (A) of a thin film transistor. The thin film transistor uses an oxide semiconductor film for a channel. FIG. 14A is a Vg-Id curve before UV ray irradiation, FIG. 14B is a Vg-Id curve at the time of UV ray irradiation, and FIG. 14C is a Vg-Id curve after UV ray irradiation. In the graphs, Vth represents a threshold voltage, S-value represents an S value, and VDS represents a drain voltage. The UV ray has a wavelength of 254 nm and an intensity of 0.06 mW/cm$^2$, and irradiation time is three minutes. An In—Ga—Zn—O-based oxide semiconductor film was used for the channel. The thin film transistor has a bottom-gate structure illustrated in FIG. 3. The UV ray was emitted to the channel from above the channel.

When the thin film transistor was irradiated with the UV ray, the threshold voltage changed from −0.54 V to −3.23 V, and further changed to −2.16 V after the UV ray irradiation. The thin film transistor is operated by utilizing this phenomenon.

This application is based on Japanese Patent Application serial no. 2009-262764 filed with Japan Patent Office on Nov. 18, 2009, the entire contents of which are hereby incorporated by reference.

The invention claimed is:
1. A memory device comprising:
 a first memory cell; and
 a second memory cell, the first memory cell comprising a first transistor and a first memory element,
  the first transistor comprising a first channel, a first gate electrode, and a first source and drain electrodes,
    wherein the first gate electrode is part of a first word line or is electrically connected to the first word line; and
    wherein one of the first source and drain electrodes is part of a first bit line or is electrically connected to the first bit line and the other is electrically connected to the first memory element,
the second memory cell comprising a second transistor and a second memory element,
  the second transistor comprising a second channel, a second gate electrode, and a second source and drain electrodes,
    wherein the second gate electrode is part of a second word line or is electrically connected to the second word line;
    wherein the second channel is formed of an oxide semiconductor film; and
    wherein one of the second source and drain electrodes is part of a second bit line or is electrically connected to the second bit line and the other is electrically connected to the second memory element,
wherein a threshold voltage ($V_{21}$) of the second transistor before ultraviolet ray irradiation is higher than a threshold voltage ($V_1$) of the first transistor;
wherein a threshold voltage ($V_{22}$) of the second transistor at the time of ultraviolet ray irradiation is lower than the voltage $V_{21}$;
wherein a threshold voltage ($V_{23}$) of the second transistor after ultraviolet ray irradiation is lower than the voltage $V_{21}$ and higher than the voltage $V_{22}$ and the voltage $V_1$;
wherein data stored in the second memory element is read when a voltage ($V_G$) is applied to the second gate electrode of the second transistor which is being irradiated with ultraviolet rays so that the second transistor is turned on; and
wherein $V_1 \leq V_G$ (the voltage $V_G$ is equal to or higher than the voltage $V_1$), and $V_{22} \leq V_G < V_{23} < V_{21}$ (the voltage $V_G$ is equal to or higher than the voltage $V_{22}$) are satisfied.

2. The memory device according to claim 1, wherein data stored in the first memory element is read by applying the voltage $V_G$ to the first gate electrode to turn on the first transistor.

3. The memory device according to claim 1, wherein the first channel is formed of silicon.

4. The memory device according to claim 1, further comprising a writing circuit, an analog switch, and a third transistor,
  the third transistor comprising a third channel, a third gate electrode, and a third source and drain electrodes,
    the third channel comprising an oxide semiconductor film,
  wherein an output of the writing circuit is input to the analog switch;
  wherein an output of the analog switch is input to one of the second source and the drain electrodes of the second transistor;
  wherein a writing enable signal is input to one of the third source and drain electrodes, and the other of the third source and drain electrodes is connected to a first control terminal of the analog switch;
  wherein an inverted signal of the writing enable signal is input to a second control terminal of the analog switch;
  wherein a threshold voltage of the third transistor before ultraviolet ray irradiation is $V_{31}$;
  wherein a threshold voltage of the third transistor at the time of ultraviolet ray irradiation is $V_{32}$;
  wherein a threshold voltage of the third transistor after ultraviolet ray irradiation is $V_{33}$;
  wherein data is written to the second memory element in the following manner: a voltage ($V_A$) is applied to the third gate electrode which is being irradiated with ultraviolet rays so that the third transistor is turned on, the writing enable signal is input to the first control terminal, the output of the writing circuit is input to one of the second source and drain electrodes, and a voltage ($V_W$) is applied to the second gate electrode so that the second transistor is turned on; and
  wherein $V_{32} \leq V_A < V_{33} < V_{31}$ (the voltage $V_A$ is equal to or higher than the voltage $V_{32}$), and $V_{23} < V_{21} < V_W$ are satisfied.

5. A memory device comprising:
a first memory cell comprising a first transistor and a first memory element;
a second memory cell comprising a second transistor and a second memory element; and
a third transistor,
  the first transistor comprising a first channel, a first gate electrode, and a first source and drain electrodes,
    wherein the first gate electrode is part of a first word line or is electrically connected to the first word line; and
    wherein one of the first source and drain electrodes is part of a first bit line or is electrically connected to the first bit line and the other is electrically connected to the first memory element,
  the second transistor comprising a second channel, a second gate electrode, and a second source and drain electrodes,
    wherein the second gate electrode is part of a second word line or is electrically connected to the second word line; and
    wherein one of the second source and drain electrodes is part of a second bit line or is electrically connected to the second bit line and the other is electrically connected to the second memory element,
  the third transistor comprising a third channel, a third gate electrode, and a third source and drain electrodes,
    wherein the third channel is formed of an oxide semiconductor film; and
    wherein one of the third source and drain electrodes is electrically connected to the second word line and a selection signal to turn on the second transistor is input to the other of the third source and drain electrodes,
  wherein a threshold voltage of the third transistor before ultraviolet ray irradiation is $V_{31}$;
  wherein a threshold voltage of the third transistor at the time of ultraviolet ray irradiation is $V_{32}$;
  wherein a threshold voltage of the third transistor after ultraviolet ray irradiation is $V_{33}$;
  wherein data is written to and read from the second memory element in the following manner: a voltage ($V_G$) is applied to the third gate electrode which is being irradiated with ultraviolet rays so that the third transistor is turned on, and the selection signal is input to the second gate electrode so that the second transistor is turned on; and
  wherein $V_{32} \leq V_G < V_{33} < V_{31}$ (the voltage $V_G$ is equal to or higher than the voltage $V_{32}$) is satisfied.

6. The memory device according to claim 5, further comprising a decoder, a level shifter, and a buffer, wherein one of the third source and drain electrodes is electrically connected to the second word line through the level shifter and the buffer; and wherein the selection signal is input from the decoder to the other of the third source and drain electrodes.

7. The memory device according to claim 5, further comprising a decoder, a level shifter, a buffer, and an address line, wherein one of the third source and drain electrodes is electrically connected to the second word line through the decoder, the level shifter, and the buffer; and wherein the selection signal is input from the address line to the other of the third source and drain electrodes.

8. A memory device comprising:

a first memory cell comprising a first transistor and a first memory element;

a second memory cell comprising a second transistor and a second memory element;

a third transistor; and a fourth transistor, the first transistor comprising a first channel, a first gate electrode, and a first source and drain electrodes, wherein the first gate electrode is part of a first word line or is electrically connected to the first word line; and wherein one of the first source and drain electrodes is part of a first bit line or is electrically connected to the first bit line and the other is electrically connected to the first memory element, the second transistor comprising a second channel, a second gate electrode, and a second source and drain electrodes, wherein the second gate electrode is part of a second word line or is electrically connected to the second word line; and wherein one of the second source and drain electrodes is part of a second bit line or is electrically connected to the second bit line and the other is electrically connected to the second memory element, the third transistor comprising a third channel, a third gate electrode, and a third source and drain electrodes, wherein one of the third source and drain electrodes is electrically connected to the second word line and a selection signal to turn on the second transistor is input to the other of the third source and drain electrodes, the fourth transistor comprising a fourth channel, a fourth gate electrode, and a fourth source and drain electrodes, wherein the fourth channel is formed of an oxide semiconductor film; and wherein one of the fourth source and drain electrodes is electrically connected to the third gate electrode and a selection signal to turn on the third transistor is input to the other of the fourth source and drain electrodes, wherein a threshold voltage of the fourth transistor before ultraviolet ray irradiation is $V_{31}$;

wherein a threshold voltage of the fourth transistor at the time of ultraviolet ray irradiation is $V_{32}$;

wherein a threshold voltage of the fourth transistor after ultraviolet ray irradiation is $V_{33}$;

wherein data is written to and read from the second memory element in the following manner: a voltage ($V_G$) is applied to the fourth gate electrode which is being irradiated with ultraviolet rays so that the fourth transistor is turned on and thus the third transistor is turned on, and a selection signal to turn on the second transistor is input to the second gate electrode so that the second transistor is turned on; and wherein $V_{32} \leq V_G < V_{33} < V_{31}$ (the voltage $V_G$ is equal to or higher than the voltage $V_{32}$) is satisfied.

9. A memory device comprising:

a first memory cell; and a second memory cell, the first memory cell comprising a first transistor and a first memory element, the first transistor comprising a first channel, a first gate electrode, and a first source and drain electrodes;

wherein the first channel is formed of silicon; and wherein one of the first source and drain electrodes is electrically connected to the first memory element, the second memory cell comprising a second transistor and a second memory element, the second transistor comprising a second channel, a second gate electrode, and a second source and drain electrodes, wherein the second channel is formed of an oxide semiconductor film; and wherein one of the second source and drain electrodes is electrically connected to the second memory element, wherein the first memory cell and the second memory cell are formed over a same substrate.

* * * * *